(12) United States Patent
You

(10) Patent No.: US 9,741,778 B2
(45) Date of Patent: Aug. 22, 2017

(54) ORGANIC LIGHT-EMITTING DIODE (OLED) DISPLAY

(71) Applicant: Samsung Display Co., Ltd., Yongin-si, Gyeonggi-do (KR)

(72) Inventor: Chun-Gi You, Yongin-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/178,348

(22) Filed: Jun. 9, 2016

(65) Prior Publication Data

US 2016/0284777 A1   Sep. 29, 2016

Related U.S. Application Data

(63) Continuation of application No. 14/525,009, filed on Oct. 27, 2014, now Pat. No. 9,373,671.

(30) Foreign Application Priority Data

Oct. 30, 2013   (KR) .......................... 10-2013-0130450

(51) Int. Cl.
*H01L 29/08* (2006.01)
*H01L 27/32* (2006.01)
(Continued)

(52) U.S. Cl.
CPC ........ *H01L 27/3258* (2013.01); *H01L 27/124* (2013.01); *H01L 27/1225* (2013.01);
(Continued)

(58) Field of Classification Search
None
See application file for complete search history.

(56) References Cited

U.S. PATENT DOCUMENTS 9,373,671 B2 *   6/2016   You .................... H01L 27/3265
2001/0040645 A1   11/2001   Yamazaki
(Continued)

FOREIGN PATENT DOCUMENTS

KR   10-2011-0133925 A   12/2011
KR   10-2012-0078954 A   7/2012
(Continued)

*Primary Examiner* — Reema Patel
(74) *Attorney, Agent, or Firm* — Knobbe, Martens, Olson & Bear, LLP

(57) ABSTRACT

An organic light-emitting diode (OLED) display is disclosed. In one aspect, the OLED display includes a thin film transistor comprising an active layer, a gate electrode, a source electrode, and a drain electrode. A first insulating layer is formed at least between the active layer and the gate electrode and a second insulating layer formed at least between the gate, source, and drain electrodes. The OLED display also includes a third insulating layer covering the source and drain electrodes and a pixel electrode including a first portion formed in first and second openings respectively defined in the second and third insulating layers and a second portion formed outside of the second opening. A pixel defining layer is formed over the second portion of the pixel electrode and the third insulating layer and has a third opening. The third opening has an area greater than that of the second opening.

27 Claims, 15 Drawing Sheets

(51) Int. Cl.
    *H01L 51/52* (2006.01)
    *H01L 29/45* (2006.01)
    *H01L 27/12* (2006.01)

(52) U.S. Cl.
    CPC ...... *H01L 27/1255* (2013.01); *H01L 27/3246* (2013.01); *H01L 27/3248* (2013.01); *H01L 27/3265* (2013.01); *H01L 27/3279* (2013.01); *H01L 29/45* (2013.01); *H01L 51/5215* (2013.01); *H01L 51/5231* (2013.01); *H01L 2251/305* (2013.01); *H01L 2251/558* (2013.01)

(56) References Cited

U.S. PATENT DOCUMENTS

| | | |
|---|---|---|
| 2005/0110021 A1 | 5/2005 | Park et al. |
| 2010/0182552 A1 | 7/2010 | Park et al. |
| 2011/0148812 A1 | 6/2011 | Hente |
| 2011/0278575 A1 | 11/2011 | Lee et al. |
| 2011/0297944 A1 | 12/2011 | Choi et al. |
| 2012/0169217 A1 | 7/2012 | Kim et al. |
| 2013/0126882 A1 | 5/2013 | You et al. |
| 2013/0175533 A1 | 7/2013 | Lee et al. |

FOREIGN PATENT DOCUMENTS

| | | |
|---|---|---|
| KR | 10-2013-0055446 A | 5/2013 |
| KR | 10-2013-0080642 A | 7/2013 |

\* cited by examiner

ORGANIC LIGHT-EMITTING DIODE (OLED) DISPLAY

CROSS-REFERENCE TO RELATED APPLICATIONS

This application is a continuation of application Ser. No. 14/525,009, filed Oct. 27, 2014, which claims the benefit of Korean Patent Application No. 10-2013-0130450, filed on Oct. 30, 2013, in the Korean Intellectual Property Office, the disclosures of which are incorporated herein in their entirety by reference.

BACKGROUND

Field

The described technology generally relates to an organic light-emitting diode (OLED) display.

Description of the Related Technology

OLED displays include a hole injection electrode, an electron injection electrode, and an organic emitting layer formed therebetween. OLED displays are self-emissive and emit light when holes injected from the hole injection electrode and electrons injected from the electron injection electrode recombine and decay in the organic emitting layer. OLED displays have favorable characteristics such as low power consumption, high luminance, and fast response speeds, and are thus regarded as next-generation displays.

SUMMARY OF CERTAIN INVENTIVE ASPECTS

One inventive aspect is an organic light-emitting diode (OLED) display having a high light efficiency, a high yield, and an improved display quality.

Another aspect is an OLED display including a thin film transistor including an active layer, a gate electrode, and a source electrode and a drain electrode, a first insulating layer disposed between the active layer and the gate electrode, a second insulating layer disposed between the gate electrode and the source and drain electrodes, a third insulating layer covering the source and drain electrodes, a pixel electrode disposed in openings formed in the second insulating layer and the third insulating layer, wherein an end portion of the pixel electrode is disposed outside the opening formed in the third insulating layer, a fourth insulating layer having a third opening, wherein a portion of fourth insulating layer that covers the end portion of the pixel electrode is disposed outside the opening formed in the third insulating layer, an intermediate layer that is disposed on the pixel electrode and includes an organic emitting layer, and an opposite electrode disposed on the intermediate layer, wherein the third opening has an area greater than that of the second opening.

The third insulating layer may be an organic insulating layer.

The fourth insulating layer may be an organic insulating layer.

The fourth insulating layer may cover the end portion of the pixel electrode in the form of a closed loop.

The pixel electrode may include a semi-transmissive metal layer and the opposite electrode may include a reflection layer.

The semi-transmissive metal layer may include silver (Ag) or an Ag alloy.

The OLED display may further include a first transparent conductive oxide layer between the semi-transmissive metal layer and the substrate.

The OLED display may further include a second transparent conductive oxide layer between the semi-transmissive metal layer and the intermediate layer.

The OLED display may further include a light characteristics adjusting layer between the first insulating layer and the pixel electrode.

The light characteristics adjusting layer may have a thickness of about 200 Å to about 800 Å.

The light characteristics adjusting layer may include a transparent conductive oxide.

An end portion of the pixel electrode may be electrically connected to one of the source and drain electrodes via a contact hole formed in the third insulating layer.

The pixel electrode disposed in the opening formed in the third insulating layer may contact a contact layer disposed between the first insulating layer and the second insulating layer and the contact layer may be electrically connected to one of the source and drain electrodes through a contact hole formed in the second insulating layer.

The source electrode and the drain electrode may be formed of a plurality of heterogeneous metal layers having different electron mobilities.

The source electrode and the drain electrode may include a layer including molybdenum (Mo) and a layer including aluminum (Al).

The OLED display may further include a wiring protection layer on the source and drain electrodes.

Etching surfaces of the source and drain electrodes and the wiring protection layer may be the same.

The OLED display may further include a capacitor including a first electrode formed in the same layer as the active layer and a second electrode disposed in the same layer as the gate electrode.

The first electrode of the capacitor may include a semiconductor material doped with ion impurities.

The second electrode of the capacitor may include a transparent conductive oxide.

The second electrode of the capacitor may be formed of the same material as the light characteristics adjusting layer disposed between the first insulating layer and the pixel electrode.

The OLED display may further include a first pad layer formed of the same material as the source and drain electrodes and a second pad layer disposed on the first pad layer.

The second pad layer may be formed of the same material as the light characteristics adjusting layer disposed between the first insulating layer and the pixel electrode.

An opening formed in the second insulating layer, an opening formed in the third insulating layer, and an opening formed in the fourth insulating layer may overlap one another.

An opening formed in the fourth insulating layer may be greater than an opening formed in the third insulating layer.

Another aspect is an OLED display including a substrate, an insulating layer formed over the substrate and defining a plurality of openings, a plurality of pixels formed over the substrate and respectively corresponding to the openings, each of the pixels including a pixel electrode including a first portion formed in the corresponding opening and a second portion formed over the insulating layer and not forming in the opening, and a pixel defining layer formed over the second portion of the pixel electrode and the insulating layer, wherein each of the pixel defining layers has a closed loop shape, and wherein each of the pixel defining layers is spaced apart from adjacent pixel defining layers.

Each of the pixel defining layers is not formed in the corresponding opening. The length of the first portion of the pixel electrode is greater than that of the second portion of the pixel electrode. The second portion comprises a peripheral portion of the pixel electrode.

DETAILED DESCRIPTION OF CERTAIN INVENTIVE EMBODIMENTS

Figure 1:
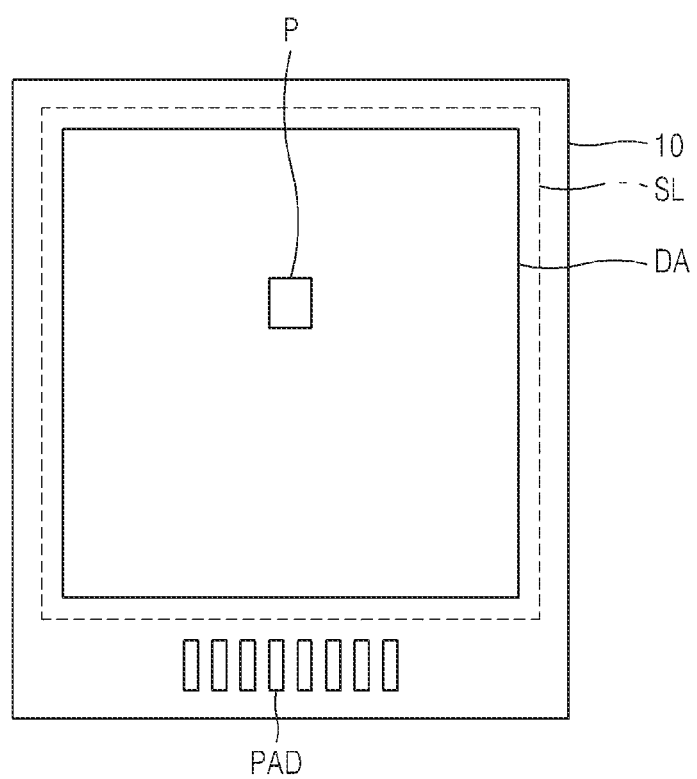
FIG. 1 is a schematic plan view illustrating an OLED display according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

While the described technology is amenable to various modifications and alternative forms, specific embodiments have been shown by way of example in the drawings and are described in detail below. The effects and features of the described technology and implementation methods thereof will be clarified through the following embodiments described with reference to the accompanying drawings. The described technology may, however, be embodied in different forms and should not be construed as limited to the embodiments set forth herein.

Hereinafter, embodiments of the described technology will be described in detail with reference to the accompanying drawings. Like reference numerals in the drawings denote like elements, and thus, duplication of their descriptions will be omitted.

It will be understood that although the terms "first", "second", etc. may be used herein to describe various components, these components should not be limited by these terms. These terms are only used to distinguish one component from another.

As used herein, the singular forms "a", "an", and "the" are intended to include the plural forms as well, unless the context clearly indicates otherwise.

It will be further understood that the terms "comprises" and/or "comprising" used herein specify the presence of the stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may also be present.

The sizes of elements in the drawings may be exaggerated for convenience of explanation. In other words, since the sizes and thicknesses of the components in the drawings are illustrated only for convenience of explanation, the following embodiments are not limited thereto.

As used herein, the term "and/or" includes any and all combinations of one or more of the associated listed items. Expressions such as "at least one of," when preceding a list of elements, modify the entire list of elements and do not modify the individual elements of the list.

Figure 2:
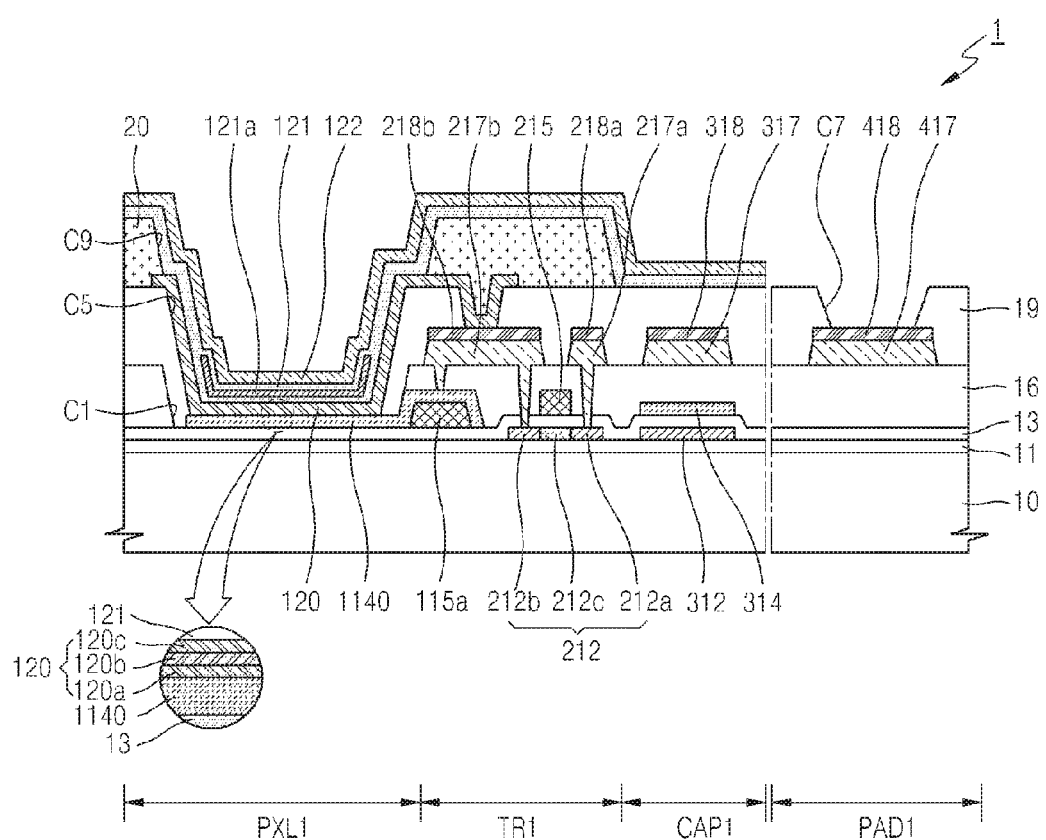
FIG. 2 is a schematic cross-sectional view illustrating portions of a pixel and a pad unit of an OLED display according to an embodiment.

FIG. 1 is a schematic plan view illustrating an OLED display 1 according to an embodiment. FIG. 2 is a schematic cross-sectional view illustrating portions of a pixel P and a pad unit PAD of the OLED display 1.

Referring to FIG. 1, a display area DA including a plurality of pixels P and displaying an image and a pad unit PAD are formed on a substrate 10 of the OLED display 1. The display area DA is formed inside a sealing line SL. Also, an encapsulation member (not shown) for encapsulating the display area DA is formed along the sealing line SL.

Referring to FIG. 2, a pixel area PXL1 including at least one organic emitting layer 121a, a transistor area TR1 including at least one thin film transistor (TFT), a capacitor area CAP1 including at least one capacitor, and a pad area PAD1 are formed on the substrate 10 of the OLED display 1.

The substrate 10 may be formed not only of glass but also of a plastic including polyethylene terephthalate (PET), polyethylene naphthalate (PEN), polyimide, or the like.

A buffer layer 11 may be further included to planarize the substrate 10 and prevent penetration of impurity elements. The buffer layer 11 may be formed as a single layer or as multiple layers including a silicon nitride and/or a silicon oxide layer.

The at least one thin film transistor includes an active layer 212, a gate electrode 215, a source electrode 217a, and a drain electrode 217b.

The active layer 212 includes a channel area 212c, a source area 212a, and a drain area 212b. The source and drain areas 212a and 212b are formed at opposing sides of the channel area 212c and are doped with ion impurities. The active layer 212 may include various materials. For example, the active layer 212 may include an inorganic semiconductor material such as amorphous silicon or crystalline silicon. Alternatively, the active layer 212 may include an oxide semiconductor material. Alternatively, the active layer 212 may include an organic semiconductor material.

A first insulating layer 13 which is a gate insulating layer is formed on the active layer 212, and a gate electrode 215 is formed on the first insulating layer 13 at a position corresponding to the channel area 212c.

The gate electrode 215 may be formed of a single layer or multiple layers formed of at least one metal such as aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), or copper (Cu).

A second insulating layer 16, which is an interlayer insulating layer, is formed on the gate electrode 215, and a source electrode 217a and a drain electrode 217b are formed on the second insulating layer 16.

The source and drain electrodes 217a and 217b respectively contact the source and drain areas 212a and 212b of the active layer 212 through an opening (not shown) formed in the second insulating layer 16. The source and drain electrodes 217a and 217b may be formed of at least two stacked layers formed of heterogeneous metals having different electron mobilities. For example, the source and drain electrodes 217a and 217b may be formed of at least two stacked metal layers formed of at least one material such as aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), or copper (Cu).

Wiring protection layers 218a and 218b are respectively formed on the source and drain electrodes 217a and 217b. The wiring protection layers 218a and 218b respectively have the same etching surfaces as the source and drain electrodes 217a and 217b. The source and drain electrodes 217a and 217b are patterned during the same mask operation as the wiring protection layers 218a and 218b.

While not illustrated in FIG. 2, wirings such as a data wiring (not shown) and an electrode power supply wiring (not shown) that are formed of the same materials as the source and drain electrodes 217a and 217b may be formed in the same layer as the source and drain electrodes 217a and 217b and the wiring protection layers 218a and 218b may be formed on the data wiring (not shown) and the electrode power supply wiring (not shown).

The first insulating layer 13 and the second insulating layer 16 may be formed of an inorganic insulating layer. The first and second insulating layers 13 and 16 may be formed of a single layer or multiple layers formed of one of $SiO_2$, SiNx, SiON, $Al_2O_3$, $TiO_2$, $Ta_2O_5$, $HfO_2$, $ZrO_2$, or lead zirconate titanate (PZT).

A third insulating layer 19 is formed on the second insulating layer 16 to cover the source and drain electrodes 217a and 217b.

The third insulating layer 19 may be formed of a single layer or multiple layers formed of an organic insulating layer. The third insulating layer 19 may include a typical polymer (e.g., poly(methyl)methacrylate (PMMA) or polystyrene (PS)), a polymer derivative having a phenol group, an acrylic polymer, an imide-based polymer, an arylether-based polymer, an amide-based polymer, a fluorine-based polymer, a p-xylene-based polymer, a vinyl alcohol-based polymer, or blends thereof.

A fourth insulating layer or pixel defining layer 20 is formed on a portion of the third insulating layer 19. As will be described later, the fourth insulating layer 20 covers end portions of the pixel electrode 120 in the form of a closed loop and is formed on a portion of the third insulating layer 19. The fourth insulating layer 20 may be formed of an organic insulating layer. The fourth insulating layer 20 may include a typical polymer (e.g., PMMA or PS), a polymer derivative having a phenol group, an acrylic polymer, an imide-based polymer, an arylether-based polymer, an amide-based polymer, a fluorine-based polymer, a p-xylene-based polymer, a vinyl alcohol-based polymer, or blends thereof.

The pixel area PXL1 includes the pixel electrode 120, an opposite electrode 122 facing the pixel electrode 120, and an intermediate layer 121 that includes an organic emitting layer 121a and is formed between the pixel electrode 120 and the opposite electrode 122.

The thin film transistor illustrated in FIG. 1 is a driving transistor that drives an OLED. Although a driving transistor is illustrated in FIG. 1, the OLED display 1 may further include a switching transistor (not shown) or a complementary transistor (not shown).

The structure of the thin film transistor as illustrated in FIG. 1 is one embodiment that may be employed in the OLED display 1 and the described technology is not limited to the structure of the thin film transistor illustrated in FIG. 1.

The pixel electrode 120 includes a semi-transmissive material. In detail, the pixel electrode 120 includes a semi-transmissive metal layer 120b. A first transparent conductive oxide layer 120a and a second transparent conductive oxide layer 120c each including a transparent conductive oxide may be further respectively formed under and over the semi-transmissive metal layer 120b.

The semi-transmissive metal layer 120b may be formed of silver (Ag) or a Ag alloy. The semi-transmissive metal layer 120b may form a micro-cavity structure with the opposite electrode 122 which is a reflective electrode to be described later, thereby improving the light efficiency of the OLED display 1.

The first and second transparent conductive oxide layers 120a and 120c may include at least one material such as indium tin oxide (ITO), indium zinc oxide (IZO), zinc oxide (ZnO), indium oxide ($In_2O_3$), indium gallium oxide (IGO), or aluminum zinc oxide (AZO).

The first transparent conductive oxide layer 120a formed under the semi-transmissive metal layer 120b may reinforce the adhesive force between the pixel electrode 120 and the first insulating layer 13.

The second transparent conductive oxide layer 120c formed on the semi-transmissive metal layer 120b may function as a barrier layer that protects the semi-transmissive metal layer 120b.

When electrons produced during an etching operation for patterning the pixel electrode 120 reach a highly reducible metal such as Ag in the semi-transmissive metal layer 120b, Ag ions included in an etchant may precipitate again as Ag. Ag that is precipitated in this manner may be the cause of particle defects that generate dark points in subsequent operations of forming the pixel electrode 120.

If wirings such as a data wiring (not shown) or an electrode power supply wiring (not shown), which are formed of the same materials as that of the source or drain electrodes 217a or 217b, or the source and drain electrodes 217a and 217b are exposed to an etchant, during the etching the pixel electrode 120, electrons from these metals may be transferred to the highly reducible Ag ions included in the etchant. Consequently, the Ag ions may reprecipitate as Ag. For example, if these metals include Mo or Al, Mo provides Ag ions with electrons received from Al, thereby reprecipitating Ag. Ag particles that are reprecipitated may attach to the pixel electrode 120 in a subsequent operation and may cause particle pollution. This may result in defects such as dark point defects.

However, while the pixel electrode 120 is patterned, the OLED display 1 is protected by being covered by the third insulating layer 19 which is an organic layer to be described later. Accordingly, Ag particles that are reprecipitated during etching of the pixel electrode 120 are prevented from reattaching to the pixel electrode 120, and thus, dark point defects may be substantially prevented.

An opening C5 formed in the third insulating layer 19 is smaller than an opening C1 formed in the second insulating layer 16, and an opening C9 formed in the fourth insulating layer 20 is larger than the opening C5 formed in the third insulating layer 19. The openings C1, C5, and C9 overlap one another. Thus, the openings C1, C5, and C9 are formed in similar areas so that the pixel electrode 120 may be located at positions where the openings C1, C5, and C9 overlap.

The pixel electrode 120 is formed in an area where the opening C1 formed in the second insulating layer 16 and the opening C5 formed in the third insulating layer 19 overlap each other and the end portions of the pixel electrode 120 are formed outside of the opening C5. That is, the pixel electrode 120 extends over the third insulating layer 19.

The opening C9 that exposes an upper surface of the pixel electrode 120 is formed in the fourth insulating layer 20 and the fourth insulating layer 20 is formed to cover the end portions of the pixel electrode 120 to reduce the influence of an electrical field at the end portions of the pixel electrode 120. A portion of the fourth insulating layer 20 that covers the end portions of the pixel electrode 120 is not formed within the opening C5 formed in the third insulating layer 19 but only on a portion of the third insulating layer 19 outside the opening C5.

Figure 3:
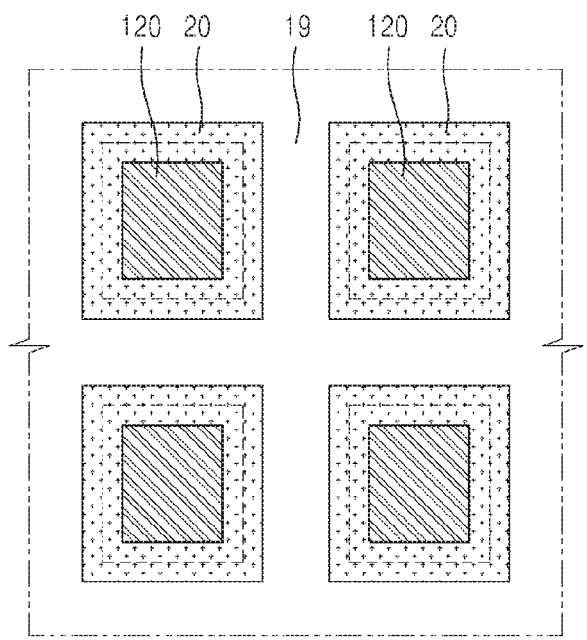
FIG. 3 is a schematic plan view illustrating the arrangement relationship between a pixel electrode and a fourth insulating layer in a plurality of pixels of an OLED display according to an embodiment.

FIG. 3 is a schematic plan view illustrating the arrangement relationship between the pixel electrode 120 and the fourth insulating layer 20 in a plurality of pixels of the OLED display 1 according to an embodiment.

Referring to FIG. 3, the pixel electrode 120 is formed in the opening C5 formed in the third insulating layer 19 (see FIG. 2) and the end portions of the pixel electrode 120 is formed on the third insulating layer 19. The end portions of the pixel electrode 120 are surrounded by the fourth insulating layer 20 that functions as a pixel defining layer. The fourth insulating layer 20 is not formed entirely on the third insulating layer 19 but covers the end portions of the pixel electrode 120 in the form of a closed loop and may be formed only on a portion of the third insulating layer 19. The fourth insulating layer 20 illustrated in FIG. 3 has a bar-shaped closed loop form; however, the described technology is not limited thereto.

The fourth insulating layer 20 which includes an organic insulating material has a relatively high absorption coefficient, and thus, out gassing may occur, which may affect the lifetime of the OLED display during a manufacturing process thereof.

Figure 4:
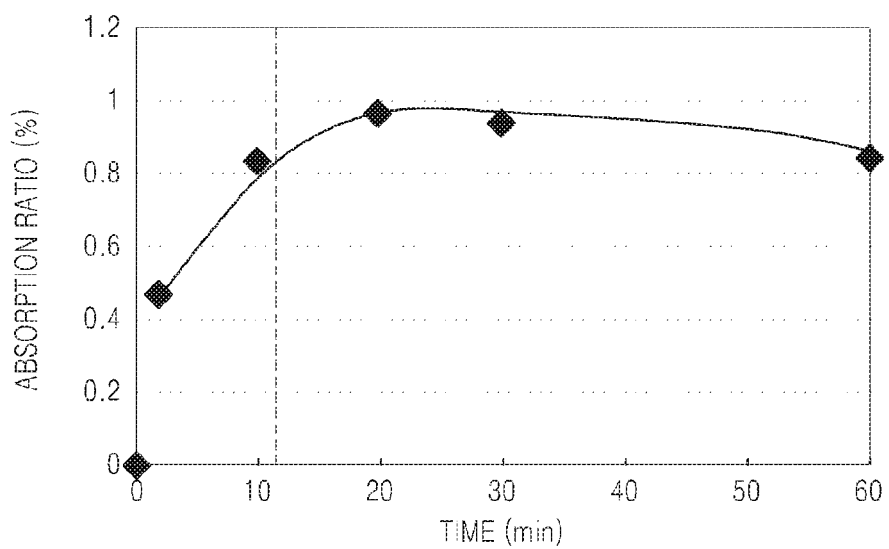
FIG. 4 is a graph showing the relationship between a standby exposure time and an absorption ratio of a fourth insulating layer.

FIG. 4 is a graph showing the relationship between a standby exposure time and an absorption ratio of the fourth insulating layer 20 according to an embodiment. The horizontal axis denotes a time period during which the fourth insulating layer 20 is exposed to air and the vertical axis denotes a water absorption ratio. The fourth insulating layer 20 is formed of polyimide in the embodiment of FIG. 4.

Referring to FIG. 4, the fourth insulating layer 20 including polyimide maintains an absorption ratio of approximately 1% even after 10 minutes of exposure to air. If an amount of the fourth insulating layer 20 including moisture increases, the influence of out gassing may also increase.

However, according to the embodiment of FIGS. 2 and 3, the fourth insulating layer 20 is not formed entirely on the third insulating layer 19 but only in a portion outside the opening C5 formed in the third insulating layer 19 on which the end portions of the pixel electrode 120 is formed. Thus, the amount of organic insulating material of which the fourth insulating layer 20 is formed may be reduced. Accordingly, the influence due to out gassing may be reduced.

Figure 5:
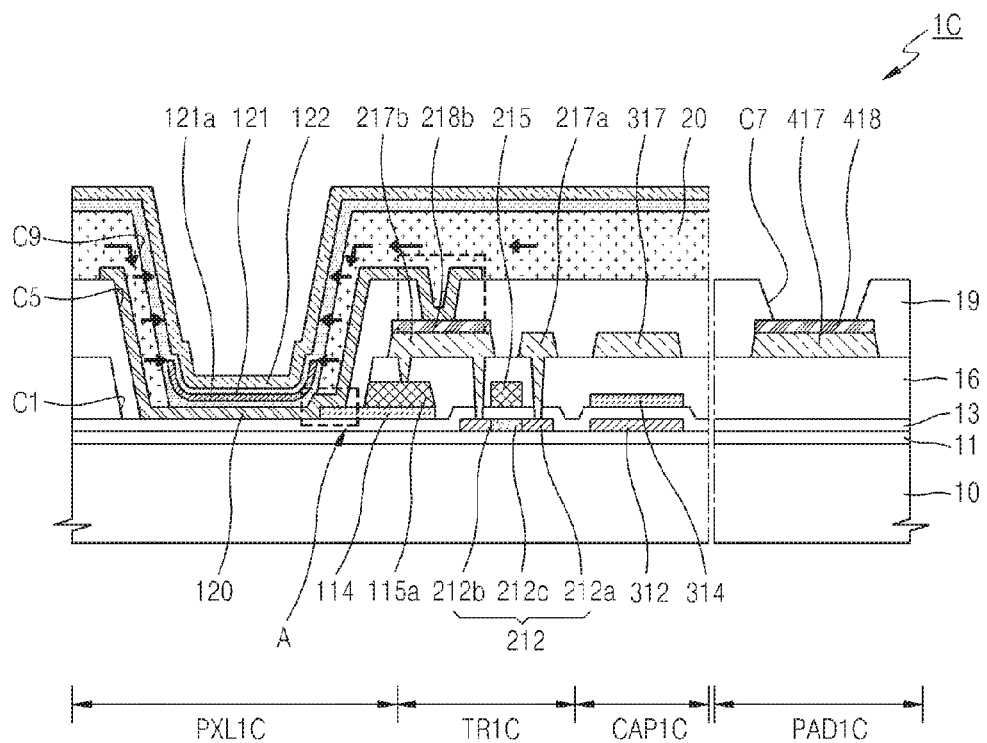
FIG. 5 is a schematic cross-sectional view illustrating portions of a pixel and a pad unit of an OLED display according to a comparative example.

FIG. 5 is a schematic cross-sectional view illustrating portions of a pixel and a pad unit of an OLED display 1C according to a comparative example.

Referring to FIG. 5, a pixel area PXL1C including at least one organic emitting layer 121*a*, a transistor area TR1C including at least one thin film transistor, a capacitor area CAP1C including at least one capacitor, and a pad area PAD1C are formed on a substrate 10 of the OLED display 1C according to the comparative example.

In the OLED display 1 according to the above-described embodiment, the fourth insulating layer 20 is formed not entirely on the third insulating layer 19 but only on a portion of the third insulating layer 19 outside the opening C5 where the end portions of the pixel electrode 120 are formed. However, in the OLED display 1C according to the comparative example, the fourth insulating layer 20 is formed not only in the opening C5 formed in the third insulating layer 19 but over the entire third insulating layer 19. Compared to the above-described embodiment, the amount of the fourth insulating layer 20 is increased in the comparative example. Thus, the amount of out gassing due to the fourth insulating layer 20 is increased and the lifetime of the OLED display 1C may be reduced accordingly.

The arrows illustrated on the fourth insulating layer 20 of FIG. 5 designate the movement direction of out gassing occurring in the fourth insulating layer 20. As shown by the arrows, the out gassing occurring in the fourth insulating layer 20 diffuses from the fourth insulating layer 20 with time and may thereby affect the organic emitting layer 121*a*.

Referring to FIG. 2, although a first pad layer 417 is located in an area exposed through a contact hole C7 formed in the third insulating layer 19, as a second pad layer 418 which is a protection layer is formed on the first pad layer 417, the first pad layer 417 is not exposed to the etchant while the pixel electrode 120 is being etched. Thus, particle defects due to reprecipitation of Ag may be prevented.

An intermediate layer 121 including an organic emitting layer 121*a* is formed between the pixel electrode 120 and the opposite electrode 122. The intermediate layer 121 may include at least one of a hole injection layer (HIL), a hole transport layer, an electron transport layer, and an electron injection layer, in addition to the organic emitting layer 121*a*. However, the described technology is not limited thereto and the intermediate layer 121 may further include various other functional layers.

The OLED illustrated in FIG. 2 is an example of a sub-pixel that forms a unit pixel and the sub-pixel may emit light of various colors. For example, the sub-pixel may emit red, green or blue light.

Alternatively, the sub-pixel may emit white light. When a sub-pixel emits white light, the OLED display 1 may further include a color converting layer or a color filter that converts white light into colored light. A sub-pixel that emits white light may have various structures, and may have, for example, a structure in which a light-emitting material emitting at least red light, a light-emitting material emitting green light, and a light-emitting material emitting blue light are stacked.

Alternatively, a sub-pixel that emits white light may have a structure in which a light-emitting material emitting at least red light, a light-emitting material emitting green light, and a light-emitting material emitting blue light are mixed.

The red, green, and blue colors are just examples, and the described technology is not limited thereto. That is, as long as white light is emitted, any combination of other various colors besides the combination of red, green, and blue colors may also be used.

The opposite electrode 122 is located on the organic emitting layer 121a as a common electrode formed commonly over all of the pixels. In the OLED display 1 according to FIGS. 2 and 3, the pixel electrode 120 is used as an anode electrode, and the opposite electrode 122 is used as a cathode electrode. The polarities of the electrodes may be obviously exchanged.

The opposite electrode 122 is a reflective electrode that includes a reflective material. The opposite electrode 122 may be formed of a single layer or multiple layers formed of at least one metal such as aluminum (Al), magnesium (Mg), nickel (Ni), calcium (Ca), or nickel fluoride (NiF).

A first light characteristics adjusting layer 1140 is formed between the pixel electrode 120 and the first insulating layer 13.

The first light characteristics adjusting layer 1140 may include the same material as a second electrode 314 of the capacitor which will be described later and may include a transparent conductive oxide including indium tin oxide (ITO), indium zinc oxide (IZO), zinc oxide (ZnO), indium oxide ($In_2O_3$), indium gallium oxide (IGO), or aluminum zinc oxide (AZO).

A semi-transmissive metal layer 120b of the pixel electrode 120 including Ag may react with the material of the first insulating layer 13 located below the pixel electrode 120. As the first transparent conductive oxide layer 120a is formed below the semi-transmissive metal layer 120b of the pixel electrode 120, the thickness of the first transparent conductive oxide layer 120a is relatively thin, and may be about 70 Å. Consequently, the first transparent conductive oxide layer 120a may not capable of completely protecting the pixel electrode 120b.

For example, when the first insulating layer 13 which is used as a gate insulating layer has a double structure in which a silicon oxide layer and a silicon nitride layer are sequentially stacked in a direction from the buffer layer 11 toward the first light characteristics adjusting layer 1140, the silicon nitride layer on the first insulating layer 13 is oxidized due to various factors during a process and a silicon oxide layer is formed on a surface of the silicon nitride layer.

If the first light characteristics adjusting layer 1140 is not formed between the pixel electrode 120 and the first insulating layer 13, Ag included in the semi-transmissive metal layer 120b diffuses by reacting with the silicon oxide layer formed on the surface of the silicon nitride layer through a pin hole in the first transparent conductive oxide layer 120a which is formed with a thin profile under the pixel electrode 120b. Consequently, voids are formed in the semi-transmissive metal layer 120b, and the diffused Ag results in dark point defects.

However, according to the embodiment of FIGS. 2 and 3, the first light characteristics adjusting layer 1140 is formed between the first insulating layer 13 and the pixel electrode 120. Thus, even when a material that easily reacts with Ag is formed in the first insulating layer 13, the first light characteristics adjusting layer 1140 may block diffusion of Ag. Thus, by controlling reactivity of Ag particles, dark point defects due to Ag particles may be remarkably prevented.

Figure 6:
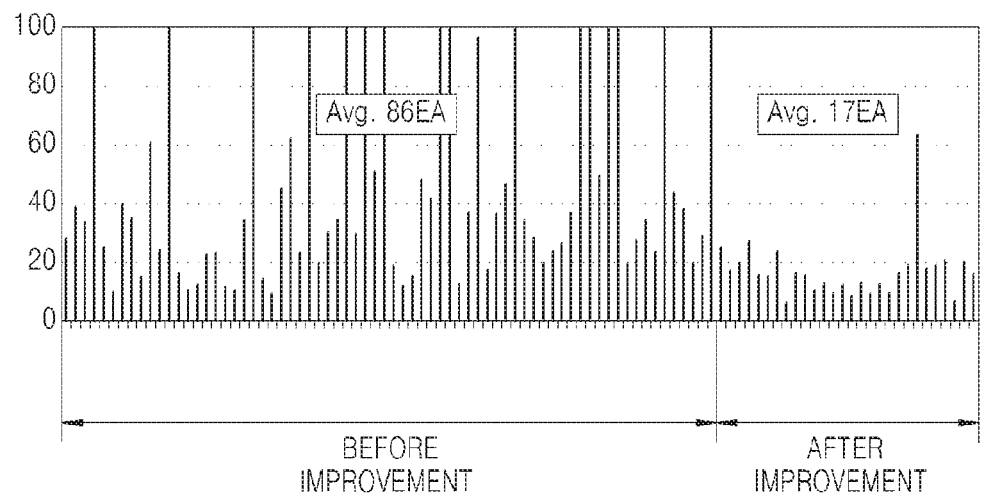
FIG. 6 illustrates the number of dark point defects of an OLED display under the same conditions before and after applying a transparent protection layer.

FIG. 6 illustrates the number of dark point defects of an OLED display before and after applying the first light characteristics adjusting layer 1140 under the same conditions.

Referring to FIG. 6, the average number of dark point defects before applying the first light characteristics adjusting layer 1140 was 86, but after the first light characteristics adjusting layer 1140 was applied, the average number of dark point defects was 17. The number of dark point defects has been significantly reduced.

Meanwhile, the first light characteristics adjusting layer 1140 according to the embodiment of FIGS. 2 and 3 not only reduces dark point defects but also improves the light efficiency of the OLED display 1.

Figure 7:
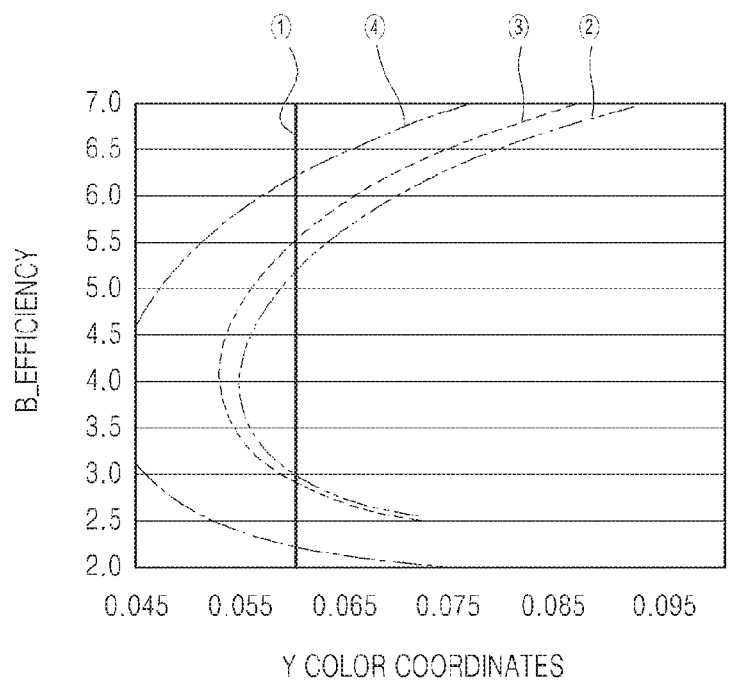
FIG. 7 is a graph showing a relationship between y color coordinates and efficiency of a blue emitting layer.

FIG. 7 is a graph showing the relationship between y color coordinates and the efficiency of a blue emitting layer.

In detail, the relationship between y color coordinates and the efficiency of a blue emitting layer is shown for the cases: ① a transparent protection layer is not included (standard example); ② the thickness of the transparent protection layer is about 150 Å; ③ the thickness of the transparent protection layer is about 300 Å; and ④ the thickness of the transparent protection layer is about 370 Å. Here, ITO was used as a transparent conductive layer (in each case of ① through ④), ITO having a thickness of about 70 Å was used as a protection layer (the first transparent conductive oxide layer 120a) under the semi-transmissive metal layer 120b).

As can be seen from the graph of FIG. 7, as the thickness of ITO increase, the range of color coordinates that are selectable with respect to the standard example broadens and the efficiency increases. While not shown in the graph, if the thickness of ITO is about 800 Å or greater, the range of color coordinates is further narrowed, and the efficiency does not further increase. Thus, considering the function of preventing reactivity of Ag of the first light characteristics adjusting layer 1140 and improvement in light characteristics thereof, the first light characteristics adjusting layer 1140 may have a thickness in the range from about 200 Å to about 800 Å.

In the embodiment of FIG. 2, the first light characteristics adjusting layer 1140 extends to the thin film transistor area TR1 to contact a second contact layer 115a that is formed of the same material as the gate electrode 215. The second contact layer 115a is electrically connected to one of a source and drain electrode of a driving transistor via a contact hole C2 (see FIG. 8D) to thereby drive the pixel electrode 120.

If the pixel electrode 120 and a driving element are connected only via a contact hole C6 (see FIG. 8F) formed in the third insulating layer 19, step coverage may be poor as the pixel electrode 120 is used as a semi-transmissive metal layer and is relatively thin. Thus, a stable connection to an etching surface of the third insulating layer 19 or to the contact hole C6 may be difficult. However, according to the embodiment of FIG. 2, even if connection via the contact hole C6 formed in the third insulating layer 19 fails, the pixel electrode 120 may be connected to the second contact layer 115 via the first light characteristics adjusting layer 1140 in a bottom portion of the opening C5 and the second contact layer 115a may be connected to a driving element via a contact hole C2 (see FIG. 8D) formed in the second insulating layer 16. Accordingly, a signal from the driving element may be stably received.

In the capacitor area CAP1, a capacitor including a first electrode 312 formed in the same layer as the active layer 212, a second electrode 314 formed in the same layer as the gate electrode 215, and a third electrode 317 formed in the same layer as the source and drain electrodes 217a and 217b may be formed on the substrate 10 and the buffer layer 11.

The first electrode 312 of the capacitor may be formed of a semiconductor doped with ion impurities, like the source area 212a and the drain area 212b of the active layer 212.

Although the second electrode 314 of the capacitor is also formed on the first insulating layer 13 like the gate electrode 215, the second electrode 314 is formed of a different material. The material of the second electrode 314 may include a transparent conductive oxide. The capacitor having a metal-insulator-metal (MIM) structure may be formed by including the second electrode 314, which is a semiconductor doped with ion impurities.

The third electrode 317 of the capacitor may be formed of the same material as the source and drain electrodes 217a and 217b. As described above, as the third electrode 317 is covered by the third insulating layer 19 which is an organic layer, while the pixel electrode 120 including Ag is being etched, the third electrode 317 is not exposed to the etchant including Ag ions. Accordingly, particle defects due to reprecipitation of Ag may be prevented. Also, by connecting the capacitor parallel to the first electrode 312 and the second electrode 314, electrostatic capacitance of an OLED display may be increased without increasing the surface area of the capacitor. Accordingly, the surface area of the capacitor may be reduced by an increase in electrostatic capacitance, and accordingly, an aperture ratio may be increased.

An electrode protection layer 318 may be formed on the third electrode 317 of the capacitor. The third electrode 317 and the electrode protection layer 318 of the capacitor have the same etching surfaces because they are patterned in the same mask operation.

In an outer portion of the display area DA, a pad area PAD1 includes a pad electrode which is a connection terminal of an external driver.

The first pad layer 417 may include a plurality of metal layers having different electron mobilities, like the source and drain electrodes 217a and 217b. For example, the first pad layer 417 may be formed of a multi-layer formed of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), or copper (Cu).

The second pad layer 418 may be formed of a transparent conductive oxide that includes at least one material such as indium tin oxide (ITO), indium zinc oxide (IZO), zinc oxide (ZnO), indium oxide ($In_2O_3$), indium gallium oxide (IGO), or aluminum zinc oxide (AZO). Accordingly, the first pad layer 417 may be prevented from being exposed to moisture and oxygen, thereby preventing a decrease in the reliability of the first pad layer 417 the pad area PAD1.

As described above, the first pad layer 417 may be formed in an area exposed through the contact hole C7 formed in the third insulating layer 19. However, since the second pad layer 418 which is a protection layer is formed on the first pad layer 417, the first pad layer 417 is not exposed to the etchant while the pixel electrode 120 is being etched.

Moreover, as an end portion of the first pad layer 417 that is sensitive to the external environment such as moisture or oxygen is covered by the third insulating layer 19, the end portion of the first pad layer 417 is also not exposed to the etchant during etching of the pixel electrode 120.

Consequently, particle defects due to reprecipitation of Ag may be prevented and a decrease in the reliability of the pad electrode may be prevented.

Although not illustrated in FIG. 2, the OLED display 1 may further include an encapsulation member (not shown) for encapsulating a display area including the pixel area PXL1, the capacitor area CAP1, and the thin film transistor area TR1. The encapsulation member may be formed of, for example, a substrate including a glass material, a metal film, or an encapsulation thin film formed by alternately disposing an organic insulating layer and an inorganic insulating layer.

FIGS. 8A through 8H are schematic cross-sectional views illustrating a method of manufacturing the OLED display 1, according to an embodiment.

Figure 8A:
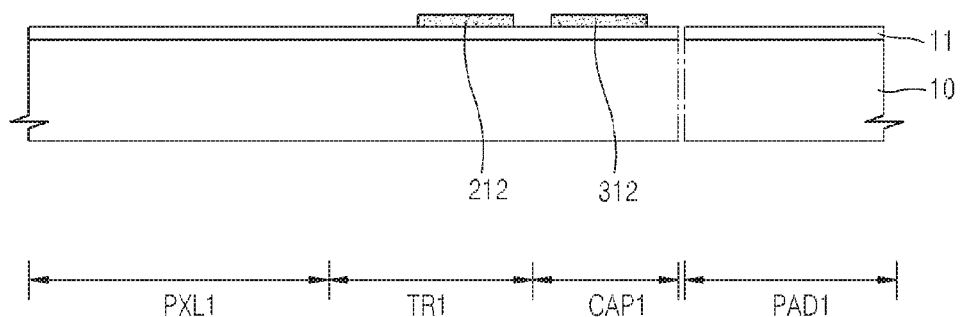
FIGS. 8A through 8H are schematic cross-sectional views illustrating a method of manufacturing an OLED display according to an embodiment.

FIG. 8A is a schematic cross-sectional view illustrating a first mask operation of the OLED display 1.

Referring to FIG. 8A, the buffer layer 11 is formed on the substrate 10 and a semiconductor layer (not shown) is formed on the buffer layer 11. The semiconductor layer (not shown) is patterned to form the active layer 212 and the first electrode 312 of the capacitor.

While not illustrated in FIG. 8A, the semiconductor layer (not shown) may be coated with a photoresist (not shown) and the semiconductor layer (not shown) may be patterned by using a photolithography method using a first photomask (not shown), thereby forming the active layer 212 and the first electrode 312 described above. The first mask operation using a photolithography method is performed by exposing the first photomask (not shown) by using exposure equipment and then performing a series of processes such as developing, etching, and stripping or ashing.

The semiconductor layer may be formed of amorphous silicon or crystalline polysilicon. The crystalline polysilicon may be formed by crystallizing amorphous silicon. Example methods for crystallizing amorphous silicon include rapid thermal annealing (RTA), solid phase crystallization (SPC), excimer laser annealing (ELA), metal induced crystallization (MIC), or metal induced lateral crystallization (MILC). The semiconductor layer (not shown) is not limited to amorphous or crystalline silicon and may include an oxide semiconductor.

Figure 8B:
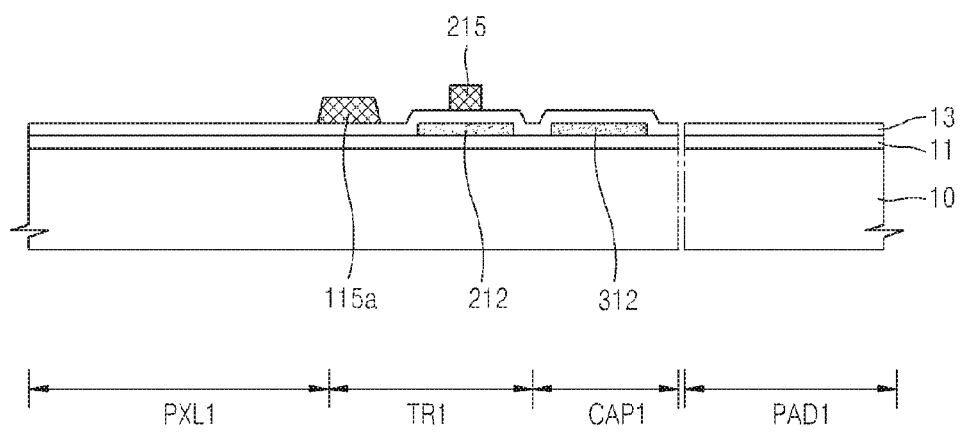

FIG. 8B is a schematic cross-sectional view illustrating a second mask operation of the OLED display 1.

The first insulating layer 13 is formed on the resultant product of the first mask operation and a first metal layer (not shown) is formed on the first insulating layer 13 and patterned.

The first metal layer (not shown) may be formed of a single layer or multiple layers formed of at least one metal such as aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), or copper (Cu). As a result of the patterning, the second contact layer 115a of a pixel electrode contact portion and the gate electrode 215 are formed on the first insulating layer 13.

Figure 8C:
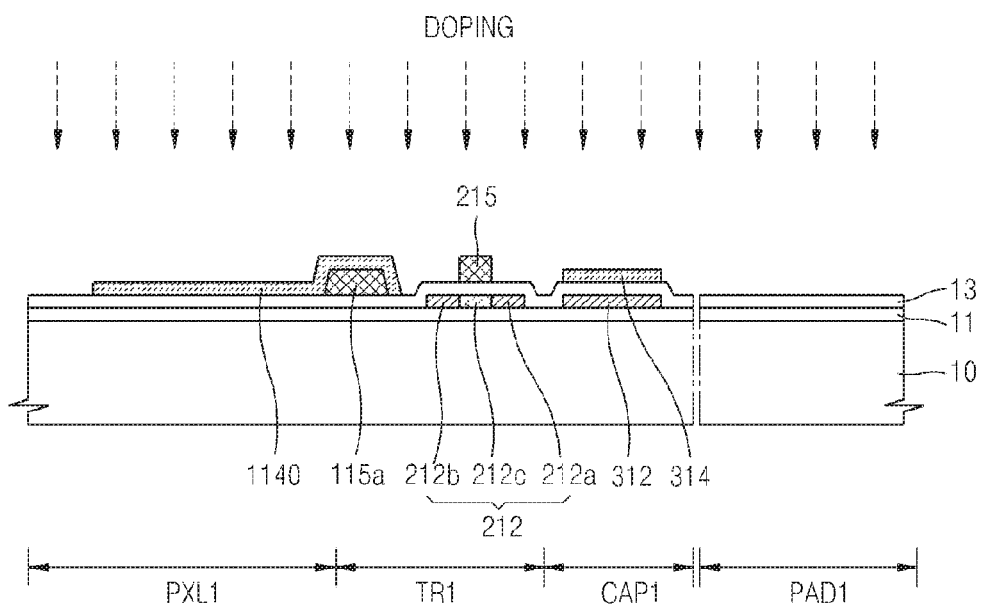

FIG. 8C is a schematic cross-sectional view illustrating a third mask operation of the OLED display 1.

A transparent conductive oxide layer (not shown) is stacked on the resultant product of the second mask operation of FIG. 8B and patterned. As a result of the patterning, the first light characteristics adjusting layer 1140 and the second electrode 314 of the capacitor are formed.

The structure formed as described above may be doped with ion impurities. The ion impurities may be boron (B) or phosphorus (P) ions and the structure may be doped with a density of about $1 \times 10^{15}$ atoms/cm$^2$ or greater by using the active layer 212 of the thin film transistor and the first electrode 312 of the capacitor as a target.

By doping the active layer 212 with ion impurities using the gate electrode 215 as a self-align mask, the active layer 212 includes the source area 212a, the drain area 212b, and the channel area 212c doped with ion impurities. The channel area 212c is positioned between the source and drain areas 212a and 212b. The first electrode 312 of the capacitor may also be doped with ion impurities to form an electrode that forms a MIM CAP structure.

Accordingly, the active layer 212 and the first electrode 312 of the capacitor are doped in a single doping operation, thereby reducing the manufacturing costs by reduction in the number of doping processes.

Figure 8D:
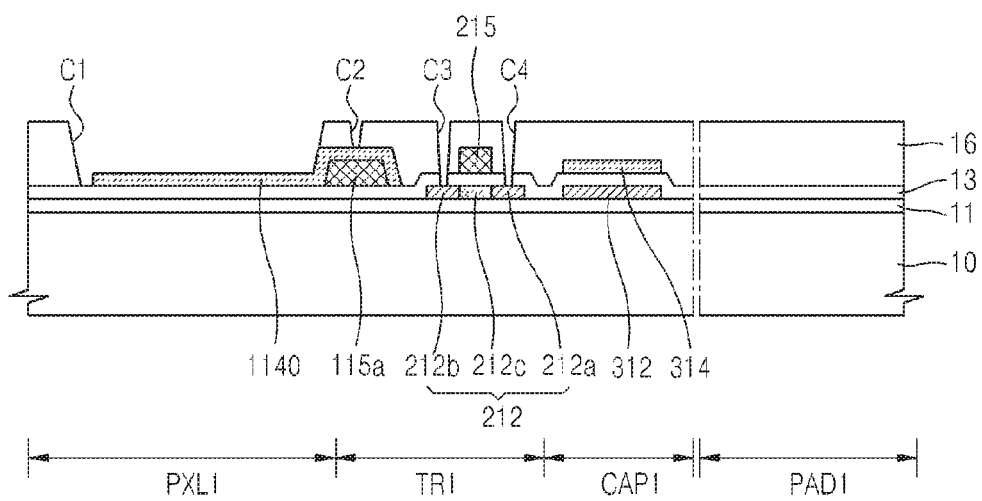

FIG. 8D is a schematic cross-sectional view illustrating the result of a fourth mask operation of the OLED display 1.

Referring to FIG. 8D, the second insulating layer 16 is formed on the resultant product of the third mask operation of FIG. 8C and the second insulating layer 16 is patterned to form openings C3 and C4 that expose the source and drain areas 212a and 212b of the active layer 212, an opening C2 that exposes the second contact layer 115a, and an opening C1 in an area separated from the active layer 212 where the pixel electrode 120 which will be described later is to be formed.

Figure 8E:
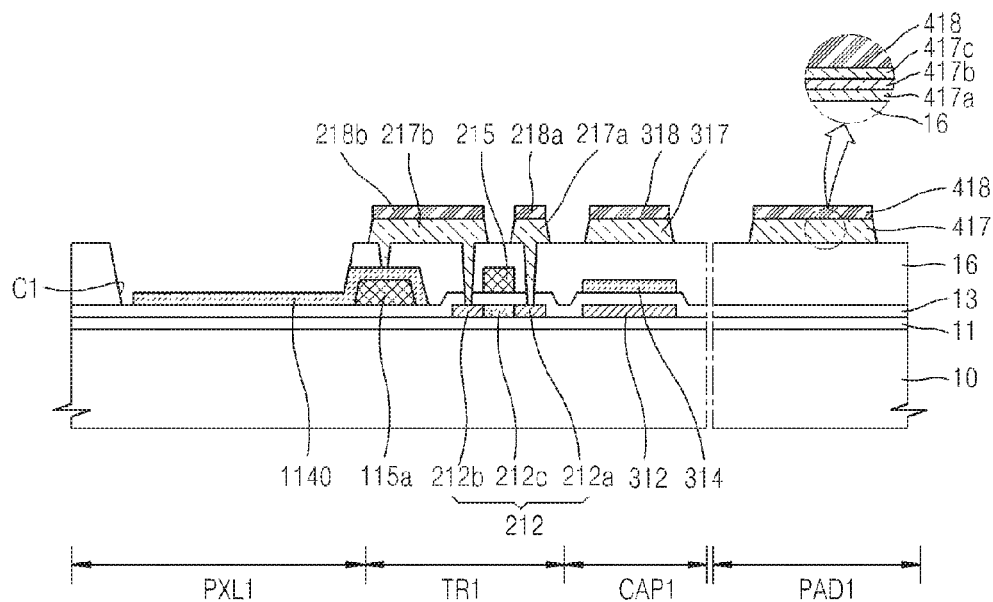

FIG. 8E is a schematic cross-sectional view illustrating the result of a fifth mask operation of the OLED display 1.

Referring to FIG. 8E, a second metal layer (not shown) and a protection layer (not shown) are continuously formed on the resultant product of the fourth mask operation. The second metal layer (not shown) and the protection layer (not shown) are simultaneously patterned, thereby forming the source and drain electrodes 217a and 217b, the wiring protection layers 218a and 218b, the third electrode 317 and the electrode protection layer 318 of the capacitor, and the first pad layer 417 and the second pad layer 418 of the pad electrode in a single mask operation.

The second metal layer (not shown) may be formed of at least two heterogeneous metal layers having different electron mobilities. For example, the second metal layer (not shown) may be formed of at least two metal layers such as aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), copper (Cu), or alloys thereof.

To illustrate the structure of the second metal layer (not shown), the structure of the first pad layer 417 is illustrated in detail. In some embodiments, the second metal layer (not shown) is formed of a first layer 417a including Mo, a second layer 417b including Al, and a third layer 417c including Mo.

The second layer 417b including Al may be a metal layer having a low resistance and excellent electrical characteristics and the first layer 417a that is formed below the second layer 417b and includes Mo increases the adhesive force with respect to the second insulating layer 16, and the third layer 417c that is formed on the second layer 417b and includes Mo functions as a barrier layer that prevents hillocks, oxidation, and diffusion of Al included in the second layer 417b.

The protection layer (not shown) may include a transparent conductive oxide.

Meanwhile, while not illustrated in the drawings in detail, the second metal layer (not shown) may be patterned in the fifth mask operation to also form data wirings.

Figure 8F:
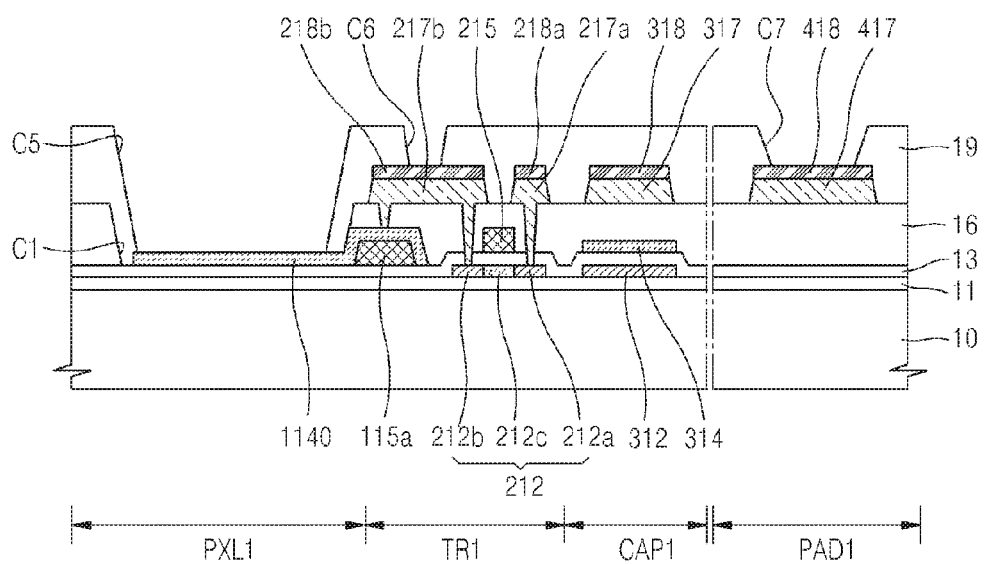

FIG. 8F is a schematic cross-sectional view illustrating the resultant product of a sixth mask operation of the OLED display 1.

Referring to FIG. 8F, a third insulating layer 19 is formed on the resultant product of the fifth mask operation and the third insulating layer 19 is patterned to form contact holes C7 and C6 that expose upper portions of the second pad layer 418 and the wiring protection layer 218b and an opening C5 in the pixel area PXL1 in which the pixel electrode 120 to be described later is to be formed.

The third insulating layer 19 is formed to completely surround the source and drain electrodes 217a and 217b so as to prevent contact of heterogeneous wirings having different potentials to the etchant including Ag ions during etching of the pixel electrode 120.

The opening C5 formed in the third insulating layer 19 and the opening C1 formed in the second insulating layer 16 are formed to overlap and the opening C5 is formed to be smaller than the opening C1.

Figure 8G:
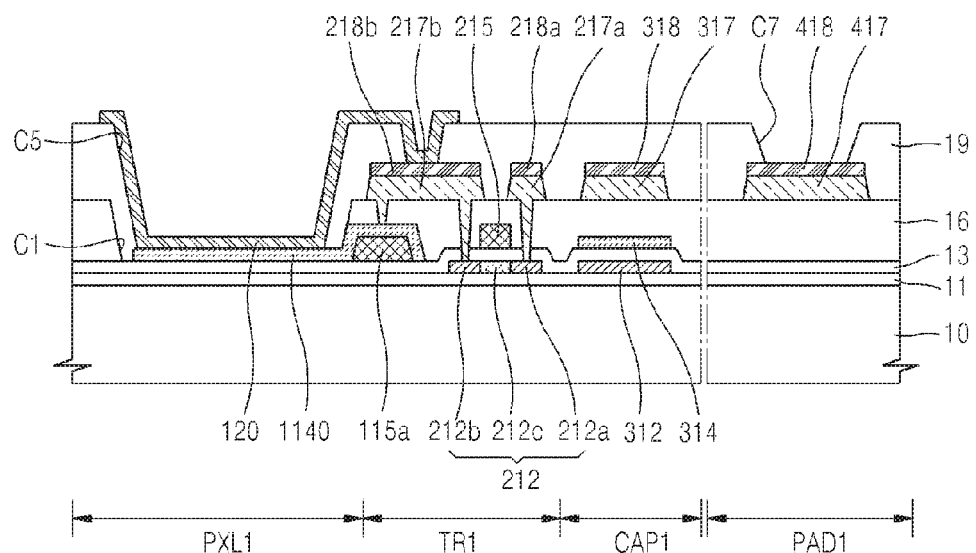

FIG. 8G is a schematic cross-sectional view illustrating the result of a seventh mask operation of the OLED display 1.

Referring to FIG. 8G, a semi-transmissive metal layer (not shown) is formed on the resultant product of the sixth mask operation of FIG. 8F and the semi-transmissive metal layer (not shown) is patterned to form the pixel electrode 120.

The pixel electrode 120 is formed in an area where the opening C1 formed in the second insulating layer 16 and the opening C5 formed in the third insulating layer 19 overlap each other and an end portion of the pixel electrode 120 is formed outside of the opening C5. That is, the end portion of the pixel electrode 120 extends over the third insulating layer 19.

The pixel electrode 120 is formed of a semi-transmissive metal layer 120b. Also, the pixel electrode 120 may further include first and second transparent conductive oxide layers 120a and 120c that are formed under and on the semi-transmissive metal layer 120b and protect the semi-transmissive metal layer 120b.

The semi-transmissive metal layer 120b may be formed of Ag or an Ag alloy. The first and second transparent conductive oxide layers 120a and 120c that include a transparent conductive oxide may include at least one material such as indium tin oxide (ITO), indium zinc oxide (IZO), zinc oxide (ZnO), indium oxide ($In_2O_3$), indium gallium oxide (IGO), or aluminum zinc oxide (AZO). The semi-transmissive metal layer 120b may form a micro-cavity structure with the opposite electrode 122 which is a reflective electrode to be described later and may increase the light efficiency of the OLED display 1.

When electrons are provided to a highly reducible metal such as Ag during an etching operation for patterning the pixel electrode 120, Ag ions included in the etchant may precipitate as Ag. If the source electrode 217a, the drain electrode 217b, the first contact layer 117 of the pixel electrode contact portion, the first pad layer 417, or data wirings (not shown) are exposed to the etchant during etching of the pixel electrode 120 including Ag, electrons from these metals may reach the Ag ions that are highly reducible and the Ag ions may reprecipitate as Ag.

However, the source and drain electrodes 217a and 217b according to the embodiment of FIG. 8 are patterned prior to the operation of patterning the pixel electrode 120 and are covered by the third insulating layer 19 which is an organic layer. Thus, during etching of the pixel electrode 120 including Ag, the source and drain electrodes 217a and 217b are not exposed to the etchant. Accordingly, particle defects due to reprecipitation of Ag may be prevented.

In addition, while the first pad layer 417 is formed in an area exposed through the contact hole C7 formed in the third insulating layer 19, since the second pad layer 418 which is a protection layer is formed on the first pad layer 417, the first pad layer 417 is not exposed to the etchant while the pixel electrode 120 is being etched. Accordingly, particle defects due to reprecipitation of Ag may be prevented.

If the first light characteristics adjusting layer 1140 is not formed between the pixel electrode 120 and the first insulating layer 13, Ag included in the semi-transmissive metal layer 120b may diffuse by reacting with a silicon oxide layer formed on the surface of the silicon nitride layer through a pin hole in the first transparent conductive oxide layer 120a which has a thin profile and is formed below the pixel electrode 120b. Consequently, voids may be formed in the pixel electrode 120b and the diffused Ag may cause dark point defects.

However, according to the embodiment of FIG. 8, since the first light characteristics adjusting layer 1140 is formed between the first insulating layer 13 and the pixel electrode 120, even when a material that easily reacts with Ag is formed on the first insulating layer 13, the first light characteristics adjusting layer 1140 may block diffusion of Ag. Thus, by controlling reactivity of Ag particles, dark point defects due to the Ag particles may be remarkably prevented.

Figure 8H:
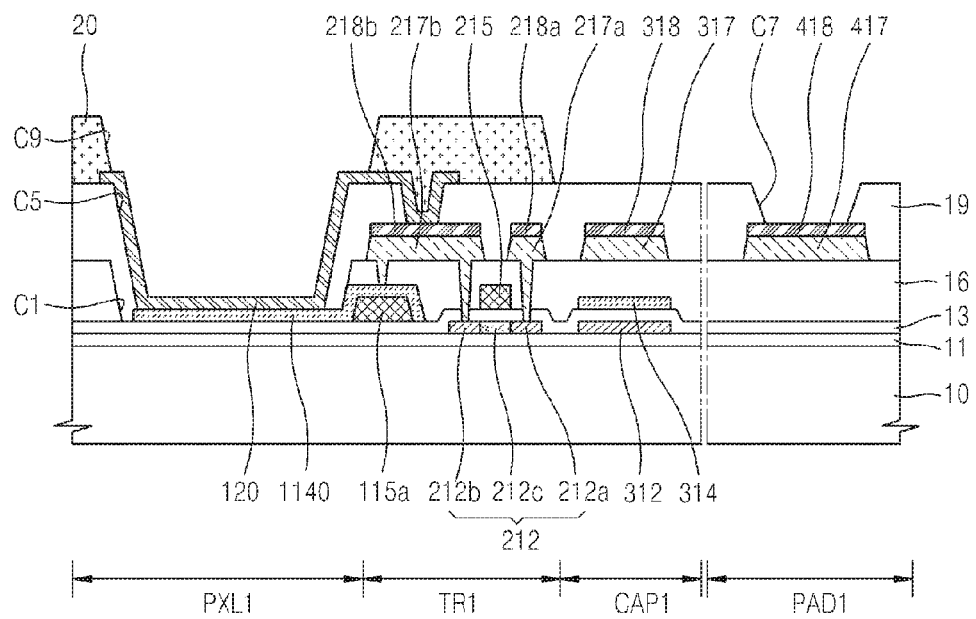

FIG. 8H is a schematic cross-sectional view illustrating the result of an eight mask operation of the OLED display 1.

Referring to FIG. 8H, a fourth insulating layer 20 is formed on the resultant product of the seventh mask operation of FIG. 8G and then the eighth mask operation of forming an opening C9 exposing an upper portion of the pixel electrode 120 is performed.

The opening C9 that exposes the upper surface of the pixel electrode 120 is formed in the fourth insulating layer 20 and the fourth insulating layer 20 is formed to cover the end portions of the pixel electrode 120 to reduce the influence of an electrical field at the end portion of the pixel electrode 120. The portion of the fourth insulating layer 20 that covers the end portions of the pixel electrode 120 is not formed in the opening C5 formed in the third insulating layer 19 but only on the third insulating layer 19 outside of the opening C5.

The fourth insulating layer 20 may be formed of an organic insulating layer such as a typical polymer (e.g., PMMA or PS), a polymer derivative having a phenol group, an acrylic polymer, an imide-based polymer, an arylether-based polymer, an amide-based polymer, a fluorine-based polymer, a p-xylene-based polymer, or a vinyl alcohol-based polymer.

The fourth insulating layer 20 which includes an organic insulating material has a high absorption coefficient, and thus, out gassing which may affect the lifetime of an OLED display may occur during a manufacturing process. However, according to the embodiment of FIG. 2, the fourth insulating layer 20 is not formed entirely on the third insulating layer 19 but only on a portion of the upper surface of the third insulating layer 19 outside of the opening C5 where the end portions of the pixel electrode 120 are formed. Thus, the amount of the organic insulating material required to form the fourth insulating layer 20 is reduced. Accordingly, the influence due to out gassing may be reduced.

The intermediate layer 121 including the organic emitting layer 121a (see FIG. 2) and the opposite electrode 122 (see FIG. 2) are formed on the resultant product of the eighth mask operation of FIG. 8H.

According to at least one embodiment, the pixel electrode 120 is formed to include the semi-transmissive metal layer 120b, thereby improving the light efficiency of the OLED display 1 due to a micro-cavity.

Also, by covering the source and drain electrodes 217a and 217b with the third insulating layer 19 which is an organic layer, the source and drain electrodes 217a and 217b are not exposed to an etchant containing Ag ions, thereby preventing particle defects due to reprecipitation of Ag.

Also, by forming the second pad layer 418, which is a protection layer, on the first pad layer 417, and a wiring protection layer 218b, which is a protection layer, on the drain electrode 217b, the first pad layer 417 and the drain electrode 217b are not be exposed to the etchant while the pixel electrode 120 is being etched, thereby preventing particle defects due to reprecipitation of Ag.

Also, as the first light characteristics adjusting layer 1140 is formed under the pixel electrode 120, even when the first insulating layer 13 is formed of a material that easily reacts with Ag, the first light characteristics adjusting layer 1140 blocks diffusion of Ag to thereby remove reactivity of Ag particles, so that dark points defects may be remarkably reduced and light characteristics may be improved.

Also, as the fourth insulating layer 20 that covers the end portions of the pixel electrode 120 is not entirely formed on the third insulating layer 19 but only on a portion of an upper portion of the third insulating layer 19. Thus, the amount of organic insulating material from which the fourth insulating layer 20 is formed may be reduced. Consequently, the influence due to out gassing may be reduced, thereby improving the lifetime of the OLED display 1.

Hereinafter, an OLED display 2 according to another embodiment will be described.

Figure 9:
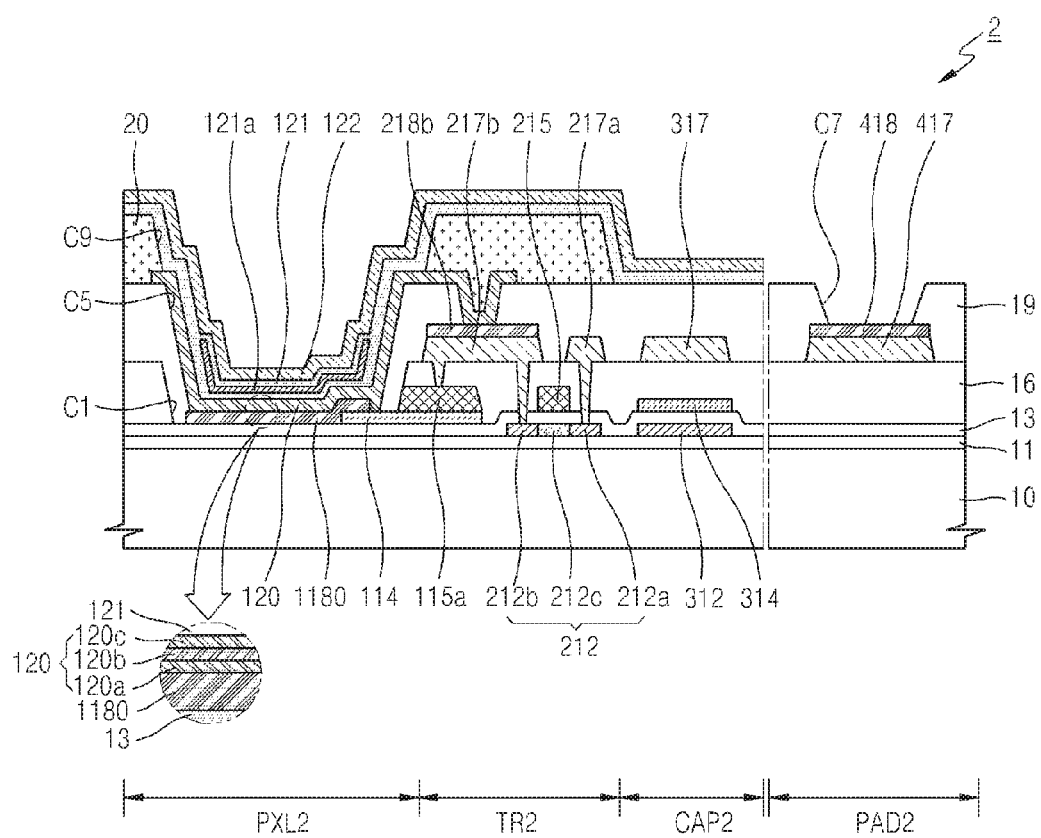
FIG. 9 is a schematic cross-sectional view illustrating portions of a pixel and a pad unit of an OLED display according to another embodiment.

FIG. 9 is a schematic cross-sectional view illustrating portions of a pixel and a pad unit of the OLED display 2.

Referring to FIG. 9, a pixel area PXL2 including at least one organic emitting layer 121a, a transistor area TR2 including at least one thin film transistor, a capacitor area CAP2 including at least one capacitor, and a pad area PAD2 are formed on a substrate 10 of the OLED display 2.

The OLED display 2 may include all of the components of the OLED display 1 described in connection with the embodiment of FIG. 2.

For example, the OLED display 2 may include the pixel electrode 120 formed of the semi-transmissive metal layer 120b, thereby increasing the light efficiency of the OLED display 2 due to a micro-cavity.

Also, by covering the source and drain electrodes 217a and 217b with the third insulating layer 19, which is an organic layer, the source and drain electrodes 217a and 217b are not exposed to an etchant containing Ag ions, thereby preventing particle defects due to reprecipitation of Ag.

Also, by forming the second pad layer 418, which is a protection layer, on the first pad layer 417 and a wiring protection layer 218b, which is a protection layer, on the drain electrode 217b, the first pad layer 417 and the drain electrode 217b are not exposed to an etchant while the pixel electrode 120 is being etched, thereby preventing particle defects due to reprecipitation of Ag.

Also, since a second light characteristics adjusting layer 1180 is formed under the pixel electrode 120, even when the first insulating layer 13 is formed of a material that easily reacts with Ag, the second light characteristics adjusting layer 1180 blocks diffusion of Ag to thereby prevent the reactivity of Ag particles, so that dark points defects may be remarkably reduced and light characteristics may be improved.

Also, as the fourth insulating layer 20 that covers the end portions of the pixel electrode 120 is not entirely formed on the third insulating layer 19 but only an a portion of an upper portion of the third insulating layer 19, the amount of organic insulating material required to form the fourth insulating layer 20 may be reduced. Consequently, the influence due to out gassing may be reduced, thereby improving the lifetime of the OLED display 2.

While the first light characteristics adjusting layer 1140 (see FIG. 2) is formed of the same material as the second electrode 314 of the capacitor in the above-described embodiment, the second light characteristics adjusting layer 1180 may be formed of the same material as the second pad layer 418. Thus, in the embodiment of FIG. 9, the second light characteristics adjusting layer 1180 may include a transparent conductive oxide including indium tin oxide (ITO), indium zinc oxide (IZO), zinc oxide (ZnO), indium oxide ($In_2O_3$), indium gallium oxide (IGO), or aluminum zinc oxide (AZO).

A pixel electrode contact portion includes a first contact layer 114 formed of a transparent conductive oxide and a second contact layer 115a formed of the same material as the gate electrode 215. An end portion of the first contact layer 114 protrudes from etching surfaces of the opening C1 formed in the second insulating layer 16 and the opening C5 formed in the third insulating layer 19. Accordingly, the pixel electrode 120 is electrically connected to the first contact layer 114 through the second light characteristics adjusting layer 1180 and the first contact layer 114 may contact the second contact layer 115a.

Hereinafter, a method of manufacturing the OLED display 2 will be described with reference to FIGS. 10A through 10I.

Figure 10A:
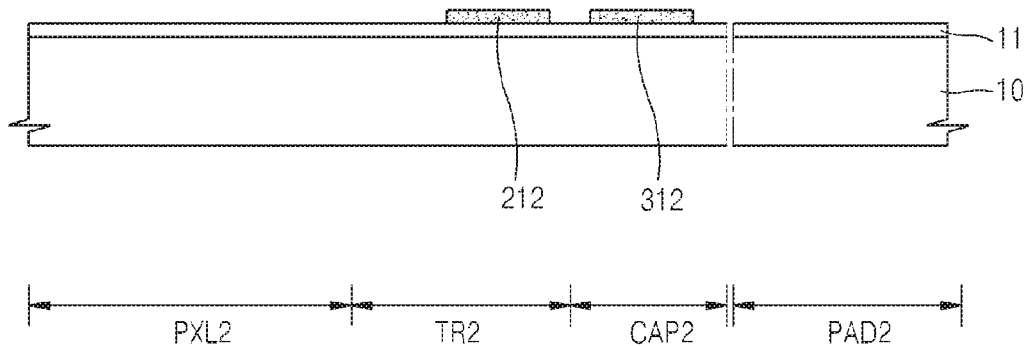
FIGS. 10A through 10I are schematic cross-sectional views illustrating a method of manufacturing an OLED display according to another embodiment.

FIG. 10A is a schematic cross-sectional view illustrating a first mask operation of the OLED display 2.

Referring to FIG. 10A, the buffer layer 11 is formed on the substrate 10 and the semiconductor layer (not shown) is formed on the buffer layer 11. The active layer 212 of the thin film transistor and the first electrode 312 of the capacitor are formed by patterning the semiconductor layer (not shown).

Figure 10B:
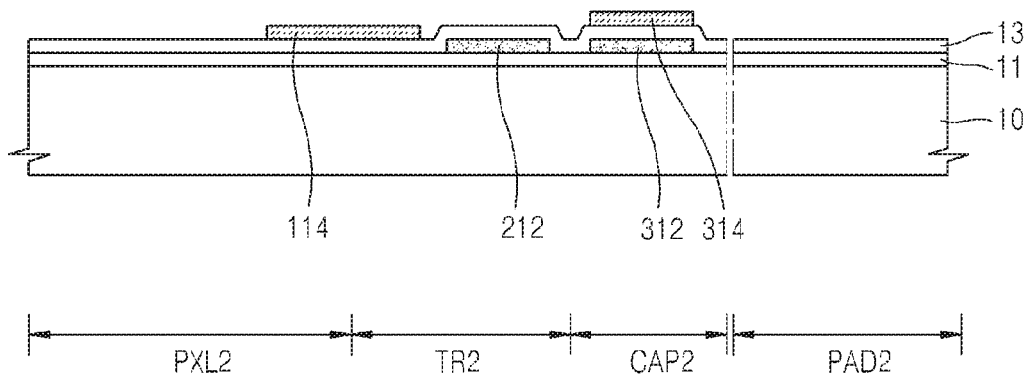

FIG. 10B is a schematic cross-sectional view illustrating a second mask operation of the OLED display 2.

The first insulating layer 13 is formed on the resultant product of the first operation of FIG. 10A and a transparent conductive oxide layer (not shown) is formed on the first insulating layer 13 and is patterned.

As a result of patterning, the first contact layer 114 and the second electrode 314 of the capacitor are formed on the first insulating layer 13.

Figure 10C:
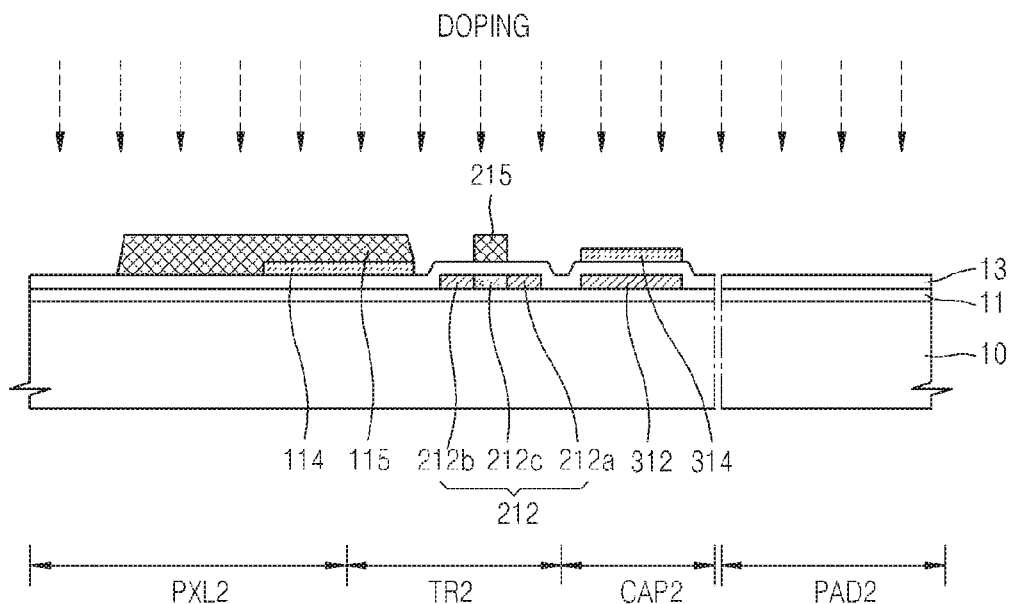

FIG. 10C is a schematic cross-sectional view of a third mask operation of the OLED display 2.

A first metal layer (not shown) is stacked on the resultant product of the second mask operation of FIG. 10B and the stacked structure is patterned. As described above, the first metal layer (not shown) may be formed of a single layer or multiple layers formed of at least one metal such as aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), or copper (Cu).

As a result of the patterning, the gate electrode 215 and the gate metal layer 115 covering the first contact layer 114 are formed on the first insulating layer 13.

The structure described above is doped with ion impurities. The ion impurities may be B or P ions and the structure may be doped at a density of about $1 \times 10^{15}$ atoms/cm$^2$ or greater by using the active layer 212 and the first electrode 312 of the capacitor as a target.

The active layer 212 may be doped with ion impurities by using the gate electrode 215 as a self-align mask. As a result, the active layer 212 has the source area 212a and the drain area 212b, which are doped with ion impurities, and the channel area 212c therebetween. The first electrode 312 of the capacitor may also be doped with ion impurities to function as an electrode that forms a MIM CAP structure.

Accordingly, the active layer 212 and the first electrode 312 of the capacitor may be doped simultaneously in a single doping operation, thereby reducing the manufacturing costs due to reduction in doping operations.

Figure 10D:
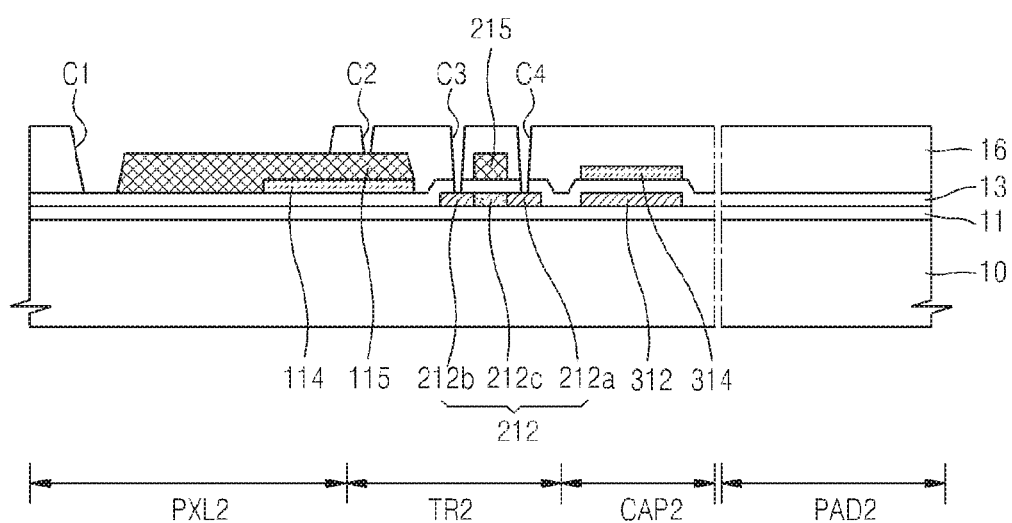

FIG. 10D is a schematic cross-sectional view illustrating the result of the fourth mask operation of the OLED display 2.

Referring to FIG. 10D, the second insulating layer 16 is formed on the resultant product of the third mask operation of FIG. 10C and the second insulating layer 16 is patterned to form the openings C3 and C4 that expose the source and drain areas 212a and 212b of the active layer 212, the opening C2 that exposes a portion of the gate metal layer 115, and the opening C1 in an area separated from the active layer 212 as an area where the pixel electrode 120 to be described later is to be formed.

Figure 10E:
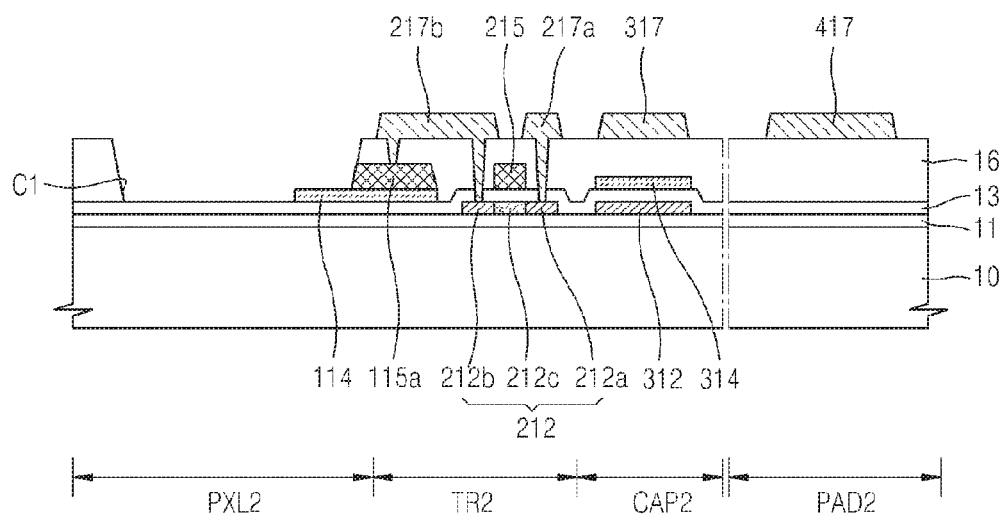

FIG. 10E is a schematic cross-sectional view illustrating the result of a fifth mask operation of the OLED display 2.

Referring to FIG. 10E, a second metal layer (not shown) is formed on the resultant product of the fourth mask operation of FIG. 10D and the second metal layer (not shown) is patterned, thereby forming the source and drain electrodes 217a and 217b, the third electrode 317 of the capacitor, and the first pad layer 417 of the pad electrode at the same time.

The second metal layer (not shown) may be formed of at least two heterogeneous metal layers having different electron mobilities. For example, the second metal layer (not shown) may be formed of at least two metal layers such as aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), copper (Cu), or alloys thereof.

Figure 10F:
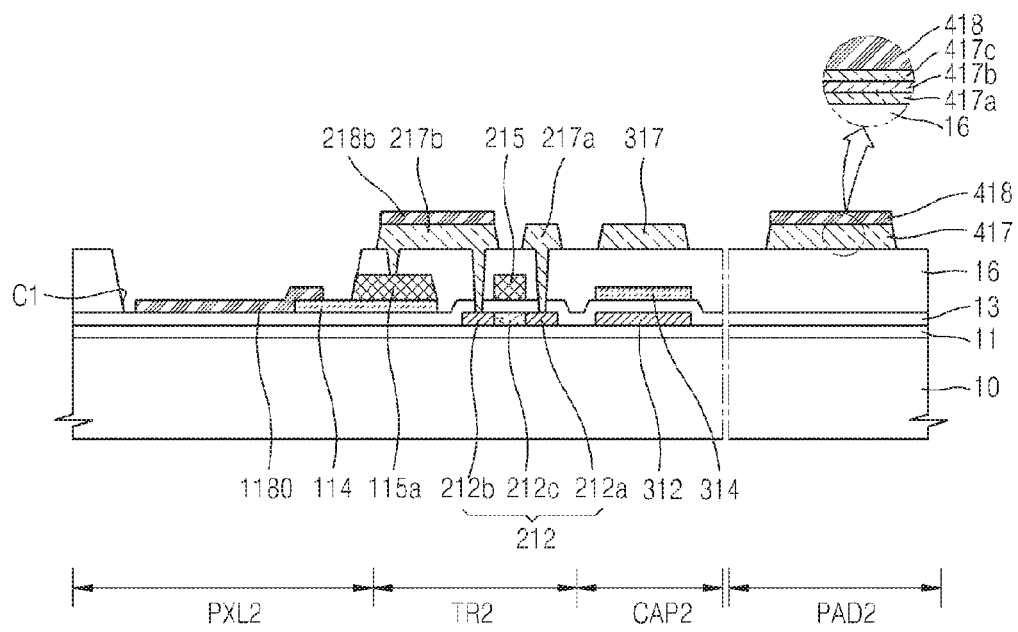

To illustrate the structure of the second metal layer (not shown), the structure of the first pad layer 417 is illustrated in detail in FIG. 10F. In some embodiments, the second metal layer (not shown) is formed of the first layer 417a including Mo, the second layer 417b including Al, and the third layer 417c including Mo.

The second layer 417b including Al may be a metal layer having a low resistance and excellent electrical characteristics and the first layer 417a that is formed below the second layer 417b and includes Mo increases the adhesive force with respect to the second insulating layers 16. The third layer 417c that is formed on the second layer 417b and includes Mo may function as a barrier layer that prevents hillocks, oxidation, and diffusion of Al included in the second layer 417b.

Furthermore, while not illustrated in the drawings in detail, the second metal layer (not shown) may be patterned in the fifth mask operation to also form a data wiring.

FIG. 10F is a schematic cross-sectional view illustrating the result of the sixth mask operation of the OLED display 2.

Referring to FIG. 10F, the second pad layer 418 and the second light characteristics adjusting layer 1180 are formed on the resultant product of the fifth mask operation of FIG. 10E.

Figure 10G:
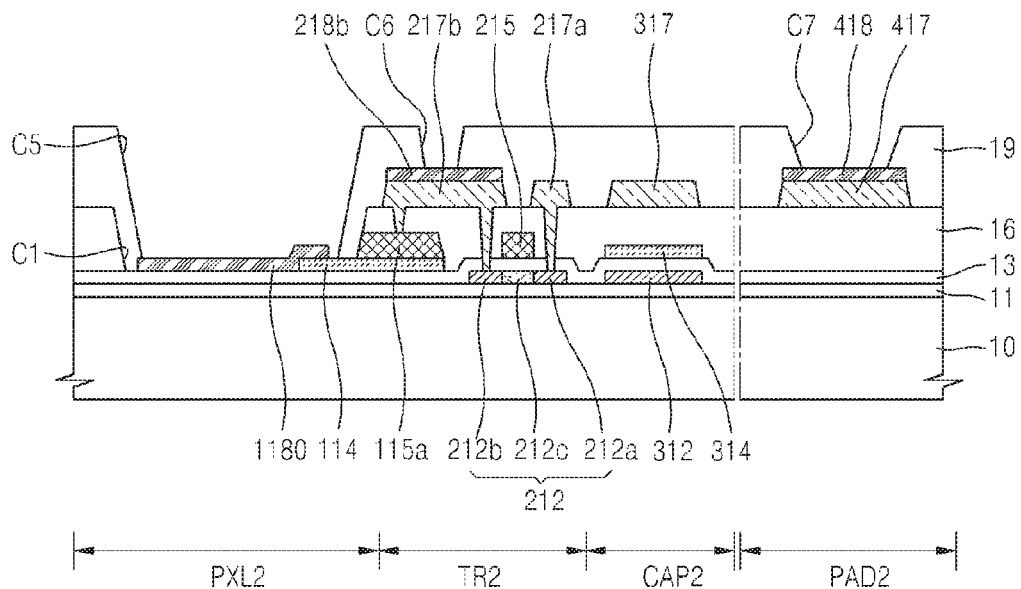

FIG. 10G is a schematic cross-sectional view illustrating the result of a seventh mask operation of the OLED display 2.

Referring to FIG. 10G, the third insulating layer 19 is formed on the resultant product of the fifth mask operation and the third insulating layer 19 is patterned to form the contact hole C7 that exposes an upper portion of the second pad layer 418 and the opening C5 in the pixel area PXL2 in which the pixel electrode 120 to be described later is to be formed.

The third insulating layer 19 is formed to completely surround the source and drain electrodes 217a and 217b so as to prevent contact of heterogeneous wirings having different potential differences during the etching of the pixel electrode 120 including Ag, which will be described later, to an etchant including Ag ions.

The opening C5 formed in the third insulating layer 19 and the opening C2 formed in the second insulating layer 16 overlap and the opening C5 formed in the third insulating layer 19 is smaller than the opening C1 formed in the second insulating layer 16.

Figure 10H:
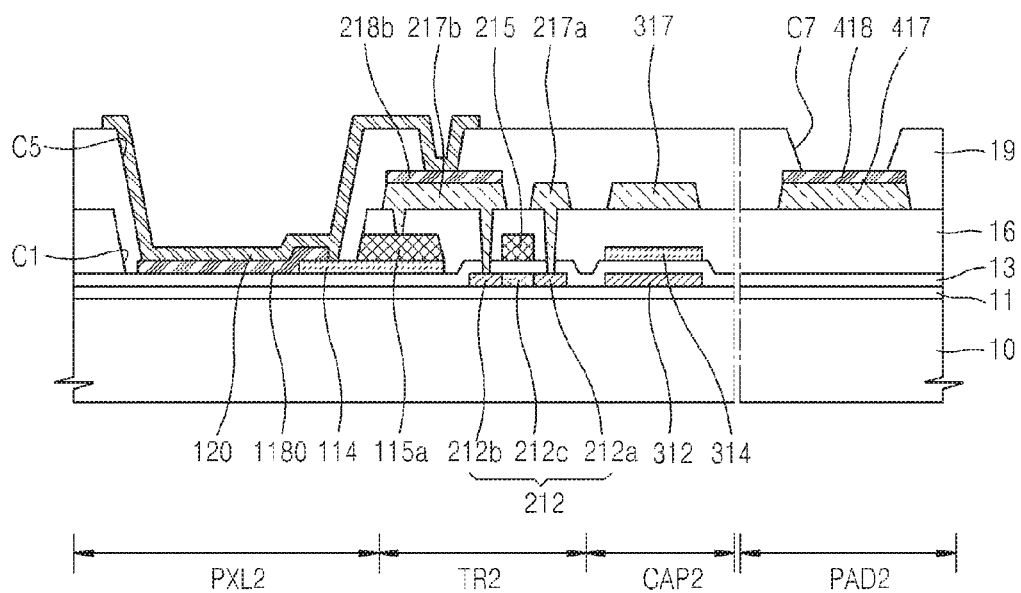

FIG. 10H is a schematic cross-sectional view illustrating the result of an eighth mask operation of the OLED display 2.

Referring to FIG. 10H, a semi-transmissive metal layer (not shown) is formed on the resultant product of the seventh mask operation of FIG. 10G and the semi-transmissive metal layer (not shown) is patterned to form the pixel electrode 120.

The pixel electrode 120 is formed in an area where the opening C1 formed in the second insulating layer 16 and the opening C5 formed in the third insulating layer 19 overlap each other and end portions of the pixel electrode 120 are formed outside of the opening C5 formed in the third insulating layer 19. That is, the end portions of the pixel electrode 120 extend over the third insulating layer 19.

The pixel electrode 120 is formed of the semi-transmissive metal layer 120b. Also, the pixel electrode 120 may further include the first and second transparent conductive oxide layers 120a and 120c that are formed under and on the semi-transmissive metal layer 120b and protect the semi-transmissive metal layer 120b.

Figure 10I:
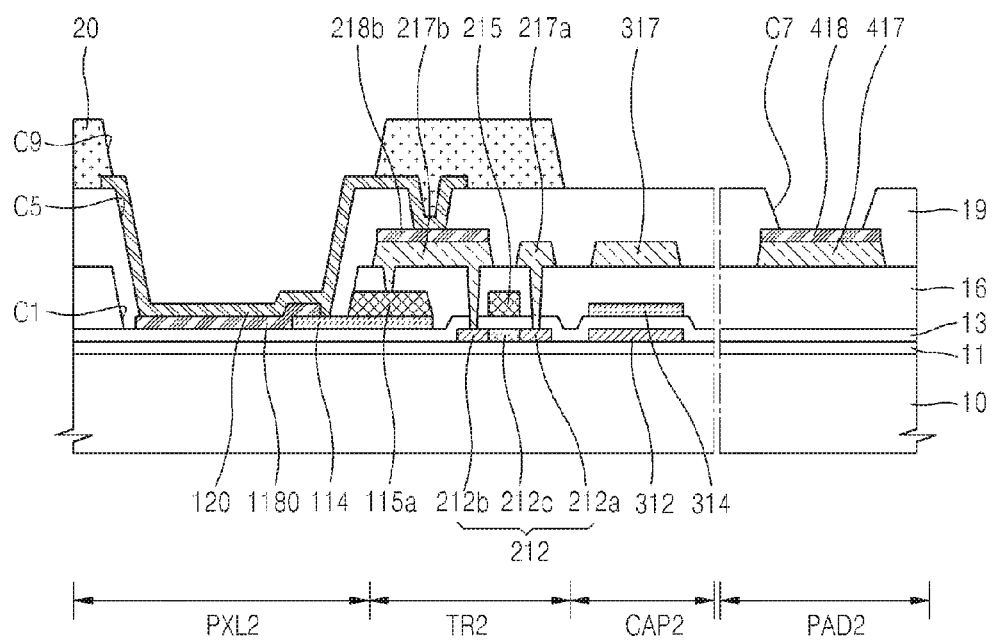

FIG. 10I is a schematic cross-sectional view illustrating the result of a ninth mask operation of the OLED display 2.

Referring to FIG. 10I, the fourth insulating layer 20 is formed on the resultant product of the eighth mask operation and the ninth mask operation of forming an opening C8 that exposes an upper portion of the pixel electrode 120 is performed.

The opening C9 that exposes an upper surface of the pixel electrode 120 is formed in the fourth insulating layer 20 and the fourth insulating layer 20 is formed to cover the end portions of the pixel electrode 120 to reduce an influence of an electrical field at the end portions of the pixel electrode 120. A portion of the fourth insulating layer 20 that covers the end portions of the pixel electrode 120 is not formed within the opening C5 formed in the third insulating layer 19 but only on a portion of the third insulating layer 19 outside of the opening C5. As the fourth insulating layer 20 is not entirely formed on the third insulating layer 19 but only on a portion of an upper portion of the third insulating layer 19 outside the opening C5, the amount of organic insulating material, from which the fourth insulating layer 20 is formed, may be reduced. Accordingly, the influence due to out gassing may be reduced.

The intermediate layer 121 including the organic emitting layer 121a (see FIG. 9) and the opposite electrode 122 (see FIG. 9) are formed on the resultant product of the ninth mask operation of FIG. 10I.

According to at least one embodiment, the pixel electrode 120 is formed of the semi-transmissive metal layer 120b, thereby improving the light efficiency of the OLED display 2 due to a micro-cavity.

Also, by covering the source and drain electrodes 217a and 217b with the third insulating layer 19, which is an organic layer, the source and drain electrodes 217a and 217b are not exposed to an etchant containing Ag ions, thereby preventing particle defects due to reprecipitation of Ag.

Also, by forming the second pad layer 418, which is a protection layer, on the first pad layer 417 and the wiring protection layer 218b, which is a protection layer, on the drain electrode 217b, the first pad layer 417 and the drain electrode 217b are not exposed to the etchant while the pixel electrode 120 is being etched, thereby preventing particle defects due to reprecipitation of Ag.

Also, since the second light characteristics adjusting layer 1180 is formed under the pixel electrode 120, even when the first insulating layer 13 is formed of a material that easily reacts with Ag, the second light characteristics adjusting layer 1180 blocks diffusion of Ag to thereby remove reactivity of Ag particles, so that dark points defects may be remarkably reduced and light characteristics of the OLED display 2 may be improved.

Also, as the fourth insulating layer 20 that covers the end portions of the pixel electrode 120 is not entirely formed on the third insulating layer 19 but only an a portion of an upper portion of the third insulating layer 19, the amount of organic insulating material, from which the fourth insulating layer 20 is formed, may be reduced. Consequently, the influence due to out gassing may be reduced, thereby improving the lifetime of the OLED display 2.

As described above, according to at least one embodiment, the OLED display has a high light efficiency, a high yield, and an improved display quality.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present invention as defined by the following claims.

What is claimed is:

1. An organic light-emitting diode (OLED) display, comprising:
   a substrate;
   a thin film transistor over the substrate comprising an active layer, a gate electrode, a source electrode, and a drain electrode;
   a pixel electrode directly contacting one of the source and the drain electrode; and a light characteristics adjusting layer between the substrate and the pixel electrode, the light characteristics adjusting layer directly contacting the source electrode or the drain electrode, wherein the pixel electrode and the light characteristics adjusting layer are electrically connected to each other.

2. The OLED display of claim 1, further comprising:
a first insulating layer formed at least between the active layer and the gate electrode;
a second insulating layer formed at least between the gate electrode and the source and drain electrodes; and
a third insulating layer covering the source and drain electrodes,
wherein the pixel electrode comprises i) a first portion formed in first and second openings respectively defined in the second and third insulating layers and ii) a second portion formed outside of the second opening.

3. The OLED display of claim 2, wherein the third insulating layer is formed at least in part of an organic material.

4. The OLED display of claim 2, further comprising a pixel defining layer formed over the second portion of the pixel electrode and the third insulating layer, wherein a third opening is formed in the pixel defining layer.

5. The OLED display of claim 4, wherein the pixel defining layer is formed at least in part of an organic material.

6. The OLED display of claim 4, wherein the pixel defining layer has a closed loop shape.

7. The OLED display of claim 4, further comprising:
an intermediate layer formed over the pixel electrode and including an organic light-emitting layer; and
an opposite electrode formed over the intermediate layer,
wherein the third opening has an area that is greater than that of the second opening.

8. The OLED display of claim 7, wherein the pixel electrode includes a semi-transmissive metal layer and wherein the opposite electrode includes a reflection layer.

9. The OLED display of claim 2, wherein the light characteristics adjusting layer is formed at least between the first insulating layer and the pixel electrode.

10. The OLED display of claim 8, wherein the light characteristics adjusting layer is connected to a contact layer between the first insulating layer and the second insulating layer.

11. The OLED display of claim 9, wherein the light characteristics adjusting layer has a thickness of about 200 Å to about 800 Å.

12. The OLED display of claim 9, wherein the light characteristics adjusting layer is formed at least in part of a transparent conductive oxide material.

13. The OLED display of claim 2, wherein the second portion of the pixel electrode is electrically connected to one of the source and drain electrodes via a contact hole formed in the third insulating layer.

14. The OLED display of claim 1, wherein the source and drain electrodes are each formed of a plurality of heterogeneous metal layers having different electron mobilities.

15. The OLED display of claim 14, wherein the source and drain electrodes each comprise a layer including molybdenum (Mo) and a layer including aluminum (Al).

16. The OLED display of claim 1, further comprising a wiring protection layer formed over the source and drain electrodes.

17. The OLED display of claim 16, wherein etching surfaces of the source and drain electrodes and the wiring protection layer are the same.

18. The OLED display of claim 1, further comprising a capacitor including a first electrode formed in the same layer as the active layer and a second electrode formed in the same layer as the gate electrode.

19. The OLED display of claim 18, wherein the first electrode of the capacitor is formed at least in part of a semiconductor material doped with ion impurities.

20. The OLED display of claim 18, wherein the second electrode of the capacitor is formed at least in part of a transparent conductive oxide material.

21. The OLED display of claim 18, wherein the light characteristics adjusting layer is formed at least between the first insulating layer and the pixel electrode, and wherein the second electrode of the capacitor is formed of the same material as the light characteristics adjusting layer.

22. The OLED display of claim 21, further comprising:
a first pad layer formed of the same material as the source and drain electrodes; and
a second pad layer formed over the first pad layer.

23. The OLED display of claim 22, wherein the second pad layer is formed of the same material as the light characteristics adjusting layer.

24. The OLED display of claim 4, wherein the first and second openings and the third opening formed in the pixel defining layer substantially overlap each other.

25. The OLED display of claim 4, wherein the pixel defining layer is not formed in the first and second openings.

26. The OLED display of claim 2, wherein the length of the first portion of the pixel electrode is greater than that of the second portion of the pixel electrode.

27. The OLED display of claim 2, wherein the second portion of the pixel electrode includes a peripheral portion of the pixel electrode.

* * * * *